(12) United States Patent
Yang

(10) Patent No.: US 11,469,311 B2
(45) Date of Patent: Oct. 11, 2022

(54) METHOD FOR FORMING SEMICONDUCTOR DEVICE WITH AIR GAP BETWEEN TWO CONDUCTIVE FEATURES

(71) Applicant: NANYA TECHNOLOGY CORPORATION, New Taipei (TW)

(72) Inventor: Sheng-Hui Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 49 days.

(21) Appl. No.: 17/185,109

(22) Filed: Feb. 25, 2021

(65) Prior Publication Data

US 2022/0271145 A1    Aug. 25, 2022

(51) Int. Cl.

| H01L 29/06 | (2006.01) |
|---|---|
| H01L 29/78 | (2006.01) |
| H01L 29/423 | (2006.01) |
| H01L 29/49 | (2006.01) |
| H01L 21/285 | (2006.01) |
| H01L 21/768 | (2006.01) |
| H01L 29/66 | (2006.01) |
| H01L 29/417 | (2006.01) |
| H01L 27/108 | (2006.01) |
| H01L 29/40 | (2006.01) |

(52) U.S. Cl.
CPC .... *H01L 29/6656* (2013.01); *H01L 27/10855* (2013.01); *H01L 29/401* (2013.01); *H01L 29/41775* (2013.01); *H01L 29/6653* (2013.01)

(58) Field of Classification Search
CPC ......... H01L 21/28141; H01L 21/28525; H01L 21/76831; H01L 21/76879; H01L 21/76897; H01L 27/10847; H01L 27/1085; H01L 27/10852; H01L 27/10855; H01L 29/0653; H01L 29/401; H01L 29/6653; H01L 29/66553; H01L 29/6656

See application file for complete search history.

(56) References Cited

U.S. PATENT DOCUMENTS

| 2016/0043171 A1* | 2/2016 | Jang | H01L 27/10888 |
|---|---|---|---|
| | | | 257/330 |
| 2017/0069726 A1* | 3/2017 | Kye | H01L 27/10894 |
| 2018/0350611 A1* | 12/2018 | Kim | H01L 21/76831 |
| 2020/0105909 A1* | 4/2020 | Wu | H01L 29/7843 |

(Continued)

*Primary Examiner* — David C Spalla
(74) *Attorney, Agent, or Firm* — Muncy, Geissler, Olds & Lowe, P.C.

(57) ABSTRACT

The present disclosure provides a method for forming a semiconductor device with an air gap for reducing the parasitic capacitance between two conductive features. The method includes forming a first source/drain region and a second source/drain region in a semiconductor substrate, and forming a first conductive feature over and electrically connected to the first source/drain region. The method also includes forming a first spacer structure on a sidewall of the first conductive feature, and forming a second conductive feature over and electrically connected to the second source/drain region. The second conductive feature is adjacent to the first spacer structure, and the first spacer structure is etched during the forming the second conductive feature. The method further includes forming a second spacer structure over the etched first spacer structure, and performing a heat treatment process to transform a portion of the first spacer structure into an air gap.

20 Claims, 23 Drawing Sheets

(56) References Cited

U.S. PATENT DOCUMENTS

| | | | |
|---|---|---|---|
| 2020/0126843 A1* | 4/2020 | Tsai | H01L 29/6653 |
| 2021/0066550 A1* | 3/2021 | Danesh | H01L 33/0095 |
| 2022/0085158 A1* | 3/2022 | Park | H01L 29/0653 |

* cited by examiner

METHOD FOR FORMING SEMICONDUCTOR DEVICE WITH AIR GAP BETWEEN TWO CONDUCTIVE FEATURES

TECHNICAL FIELD

The present disclosure relates to a method for forming a semiconductor device, and more particularly, to a method for forming a semiconductor device with an air gap for reducing the parasitic capacitance between two conductive features.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as short circuit and leakage current between neighboring conductive features. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for forming a semiconductor device is provided. The method includes forming a first source/drain region and a second source/drain region in a semiconductor substrate, and forming a first conductive feature over and electrically connected to the first source/drain region. The method also includes forming a first spacer structure on a sidewall of the first conductive feature, and forming a second conductive feature over and electrically connected to the second source/drain region. The second conductive feature is adjacent to the first spacer structure, and the first spacer structure is etched during the forming the second conductive feature. The method further includes forming a second spacer structure over the etched first spacer structure, and performing a heat treatment process to transform a portion of the first spacer structure into an air gap after the second spacer structure is formed.

In an embodiment, the first spacer structure is a tri-layer structure comprising an inner spacer contacting the first conductive feature, a middle spacer, and an outer spacer separating from the inner spacer by the middle spacer, and wherein the middle spacer is made of an energy removable material, and the energy removable material is transformed into the air gap by the heat treatment process. In an embodiment, the method further includes forming a conductive pad over and electrically connected to the second conductive feature, wherein the second spacer structure is covered by the conductive pad. In an embodiment, the formation of the first conductive feature includes etching the semiconductor substrate to form an opening over the first source/drain region, and forming a semiconductor layer over the semiconductor substrate, wherein the opening is filled by a portion of the semiconductor layer. In addition, the formation of the first conductive feature includes forming a metal layer over the semiconductor layer, forming a patterned mask over the metal layer, and etching the metal layer and the semiconductor layer using the patterned mask as a mask.

In an embodiment, the portion of the semiconductor layer in the opening is partially removed during the etching the metal layer and the semiconductor layer, and the first spacer structure is formed to cover a sidewall of the portion of the semiconductor layer and a sidewall of the patterned mask. In an embodiment, the sidewall of the patterned mask is partially exposed after the second conductive feature is formed, and the second spacer structure is in direct contact with the sidewall of the patterned mask and a top surface of the second conductive feature. In an embodiment, the method further includes forming a barrier layer covering the etched first spacer structure and the second conductive feature, forming the second spacer structure over the barrier layer, and etching the barrier layer using the second spacer structure as a mask before the heat treatment process is performed.

In another embodiment of the present disclosure, a method for forming a semiconductor device is provided. The method includes forming a first source/drain region and a second source/drain region in a semiconductor substrate, and forming a semiconductor layer over the semiconductor substrate. The method also includes forming a metal layer over the semiconductor layer, and forming a patterned mask over the metal layer. The method further includes etching the semiconductor layer and the metal layer to form a bit line structure using the patterned mask as a mask. The bit line structure is formed over and electrically connected to the first source/drain region. In addition, the method includes forming a first spacer structure on a sidewall of the bit line structure and a sidewall of the patterned mask, and forming a capacitor contact over and electrically connected to the second source/drain region, wherein the first spacer structure is sandwiched between the bit line structure and the capacitor contact. The method also includes forming a second spacer structure over the first spacer structure, and performing a heat treatment process to form an air gap in the first spacer structure after the second spacer structure is formed.

In an embodiment, the method further includes etching the semiconductor substrate to form an opening over the first source/drain region, and filling the opening with a portion of the semiconductor layer. The portion of the semiconductor layer is partially removed during the etching the semiconductor layer such that a gap is formed alongside the bit line structure. In addition, the method includes filling the gap with the first spacer structure. In an embodiment, the method further includes forming a first dielectric layer over the second source/drain region after the first spacer structure is formed, and partially etching the first dielectric layer to expose the second source/drain region. In addition, the method includes depositing a conductive material to cover the second source/drain region, and performing an etch-back process on the conductive material to form the capacitor contact, wherein the first spacer structure is partially etched during the etch-back process.

In an embodiment, the method further includes forming a sealing layer covering the etched first spacer structure and the capacitor contact before the second spacer structure is formed, wherein the sealing layer comprises at least one of silicon (Si), germanium (Ge), gallium (Ga), arsenic (As), indium (In), phosphorus (P), copper (Cu), selenium (Se), titanium (Ti), tantalum (Ta) or tungsten (W). In an embodiment, the method further includes performing an oxidation or nitridation treatment to transform the sealing layer into a barrier layer, forming the second spacer structure over the barrier layer, and etching the barrier layer using the second spacer structure as a mask. In an embodiment, the method further includes forming a second dielectric layer covering the second spacer structure and the capacitor contact, and forming a conductive pad penetrating through the second dielectric layer, wherein the conductive pad is disposed over and electrically connected to the capacitor contact, and the conductive pad is in direct contact with the second spacer structure.

In yet another embodiment of the present disclosure, a semiconductor device is provided. The semiconductor device includes a first source/drain region and a second source/drain region disposed in a semiconductor substrate, and a first conductive feature disposed over and electrically connected to the first source/drain region. The semiconductor device also includes a second conductive feature disposed over and electrically connected to the second source/drain region, and a first spacer structure sandwiched between the first conductive feature and the second conductive feature. The first spacer structure includes an air gap. The semiconductor device further includes a second spacer structure disposed over the first spacer structure. The air gap is covered by the second spacer structure.

In an embodiment, the first spacer structure comprises an inner spacer contacting the first conductive feature and an outer spacer contacting the second conductive feature, and the air gap is sandwiched between the inner spacer and the outer spacer. In an embodiment, the air gap of the first spacer structure extends into the semiconductor substrate. In an embodiment, a portion of the second conductive feature is covered by the second spacer structure. In an embodiment, the semiconductor device further includes a patterned mask disposed over the bit line structure, wherein the second spacer structure is disposed on a sidewall of the patterned mask.

In an embodiment, the semiconductor device further includes a conductive pad disposed over and electrically connected to the second conductive feature, wherein the conductive pad extends over the second spacer structure and the patterned mask. In an embodiment, the semiconductor device further includes a barrier portion sandwiched between the first spacer structure and the second spacer structure, wherein a portion of the second conductive feature is covered by the barrier portion.

Embodiments of a semiconductor device and method for forming the same are provided in the disclosure. In some embodiments, the method includes forming a first spacer structure on a sidewall of a first conductive feature, and forming a second conductive feature adjacent to the first spacer structure. In some embodiments, the method also includes forming a second spacer structure over the first spacer structure, and performing a heat treatment process to transform a portion of the first spacer structure into an air gap. Therefore, the parasitic capacitance between the first and the second conductive features may be reduced, and the remaining portions of the first spacer structure may provide additional structural support to the semiconductor device. Moreover, the second spacer structure may prevent undesirable short circuit between the first conductive feature and the subsequently formed conductive pad over the second conductive feature.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
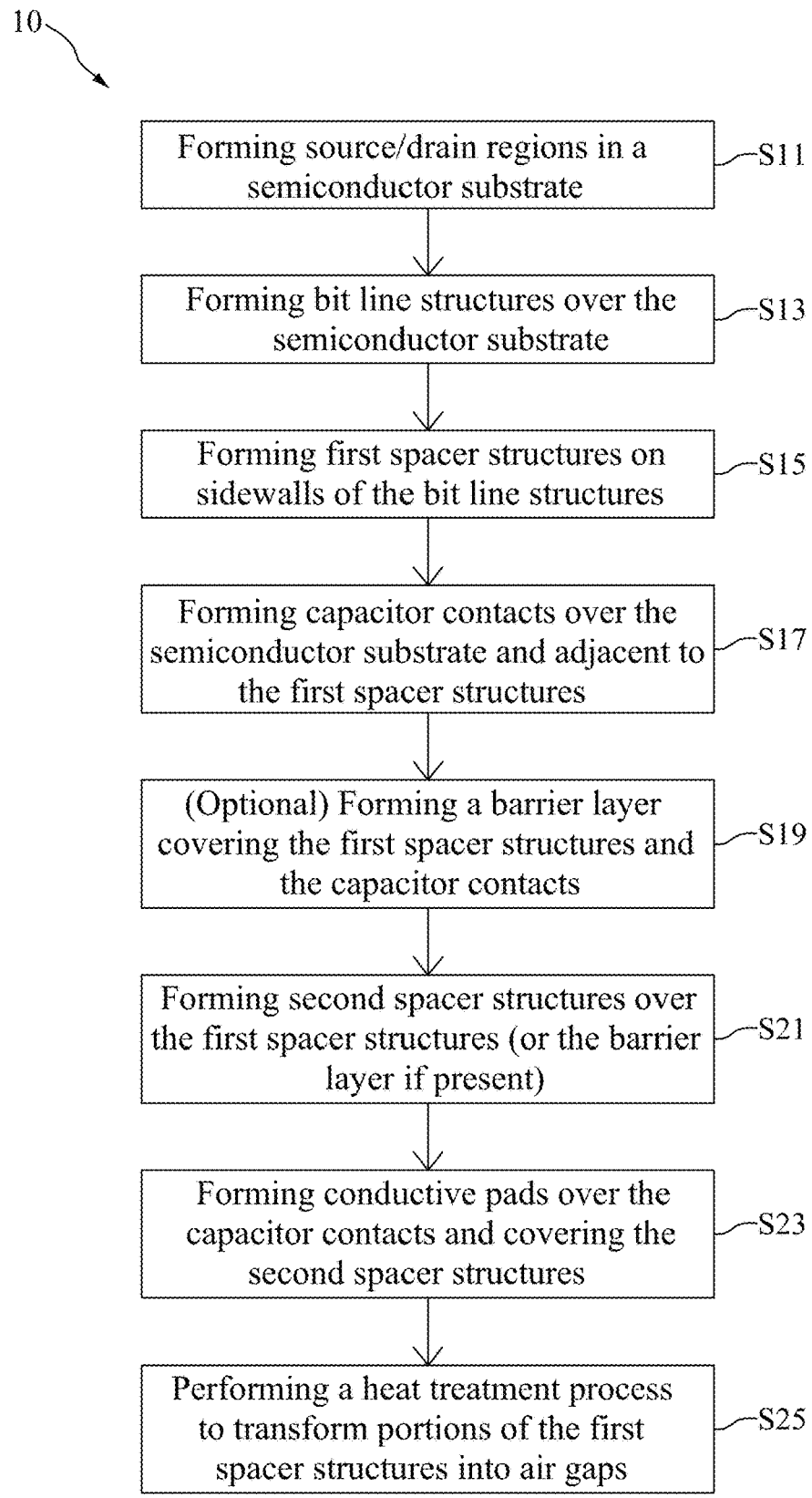
FIG. 1 is a flow diagram illustrating a method for forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 18:
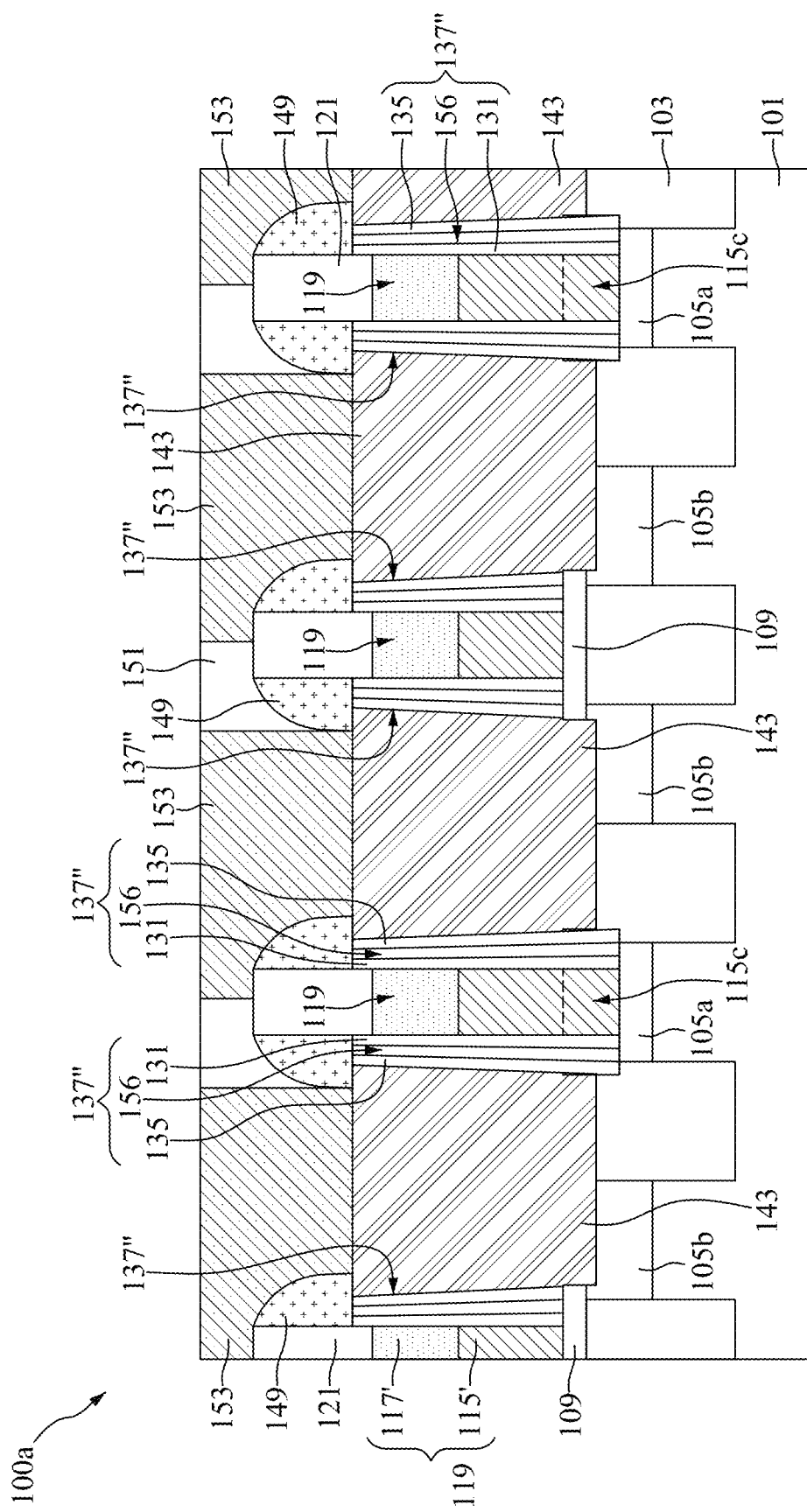
FIG. 18 is a cross-sectional view illustrating an intermediate stage of transforming portions of the first spacer structures into air gaps during the formation of the semiconductor device, in accordance with some embodiments.
Figure 23:
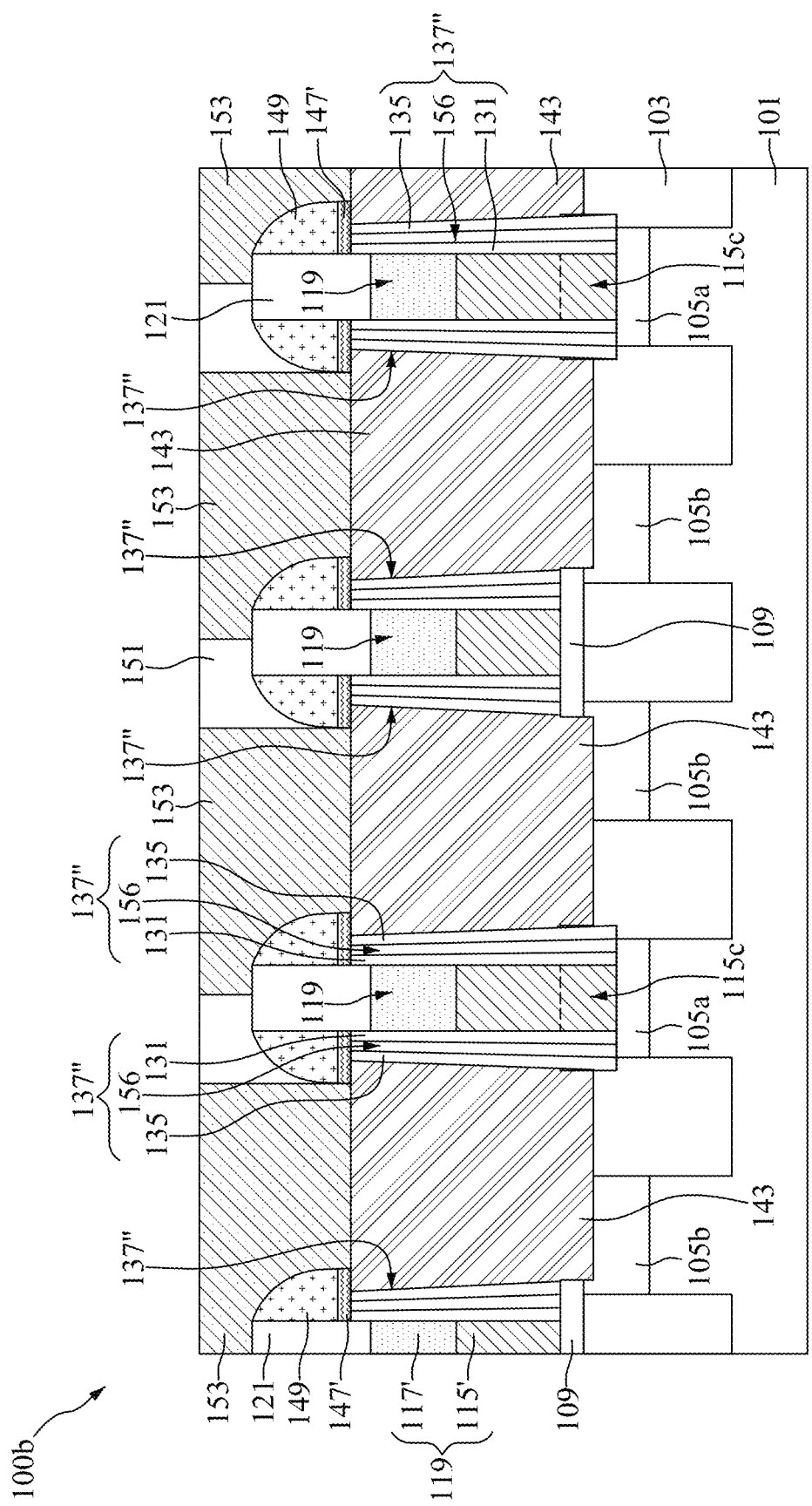
FIG. 23 is a cross-sectional view illustrating an intermediate stage of transforming portions of the first spacer structures into air gaps during the formation of the modified semiconductor device, in accordance with some embodiments.

FIG. 1 is a flow diagram illustrating a method 10 for forming a semiconductor device, such as a semiconductor device 100a shown in FIG. 18 and a semiconductor device 100b shown in FIG. 23, and the method 10 includes steps S11, S13, S15, S17, S19, S21, S23, and S25, in accordance with some embodiments. It should be noted that step S19 is optionally performed.

The steps S11 to S25 are first introduced briefly and then elaborated in connection with the following figures. As shown in FIG. 1, the method 10 begins at step S11 where source/drain regions are formed in a semiconductor substrate. In some embodiments, an isolation structure is formed in the semiconductor substrate to define active areas, and the source/drain regions are formed in the active areas. At step S13, bit line structures (also referred to as first conductive features) are formed over the semiconductor substrate. In some embodiments, the material layers of the bit line structures are sequentially formed over the semiconductor substrate, and the material layers are etched using an overlying patterned mask as a mask.

At step S15, first spacer structures are formed on sidewalls of the bit line structures. In some embodiments, each of the first spacer structures is a tri-layer structure including an inner spacer contacting the bit line structures, a middle spacer, and an outer spacer separating from the inner spacer by the middle spacer. Moreover, in some embodiments, the middle spacers of the first spacer structures are made of an energy removable material. At step S17, capacitor contacts (also referred to as second conductive features) are formed over the semiconductor substrate and adjacent to the first spacer structures. In some embodiments, a first dielectric layer is formed over the semiconductor substrate after the first spacer structures are formed, and the capacitor contacts are formed penetrating through the first dielectric layer to physically and electrically connect to the underlying source/drain regions. In addition, in some embodiments, the first spacer structures are partially etched during the formation of the capacitor contacts.

Step S19 of FIG. 1 is optionally performed. At step S19, a barrier layer is formed to cover the first spacer structures and the capacitor contacts. In some embodiments, a sealing layer is formed to cover the first spacer structures and the capacitor contacts, and an oxidation or nitridation treatment is performed to transform the sealing layer into the barrier layer. In some other embodiments, the oxidation or nitridation treatment is omitted, and the material(s) of the barrier layer is directly deposited over the first spacer structures and the capacitor contacts. At step S21, second spacer structures are formed over the first spacer structures (or the barrier layer if present). In some embodiments, the barrier layer (if present) is etched by using the second spacer structures as a mask, such that the capacitor contacts are exposed. In some embodiments, the second spacer structures extend to cover portions of the capacitor contacts.

At step S23, conductive pads are formed over the capacitor contacts and covering the second spacer structures. In some embodiments, a second dielectric layer is formed over the capacitor contacts and the second spacer structures, and the conductive pads are formed penetrating through the second dielectric layer to physically and electrically connect to the capacitor contacts. In some embodiments, the second spacer structures are covered by the conductive pads. At step S25, a heat treatment process is performed to transform portions of the first spacer structures into air gaps. In some embodiments, the middle spacers of the first spacer structures are made of an energy removable material, which can be transformed into the air gaps by the heat treatment process. After heat treatment process, the air gaps are sandwiched between the inner spacers and the outer spacer of the first spacer structures.

Note that if the step S19 is skipped, the semiconductor device 100a of FIG. 18 may be obtained. If the step S19 is performed between the steps S17 and S21, the semiconductor device 100b with barrier portions sandwiched between the first spacer structures and the second spacer structures may be obtained. In some embodiments, the semiconductor devices 100a and 100b are parts of dynamic random access memory (DRAM). The steps S11 to S25 of FIG. 1 are elaborated in connection with the following figures.

FIGS. 2, 4, 6, 8, 10, 12, 14 and 16 are top views illustrating intermediate stages in the formation of the semiconductor device 100a, and FIGS. 3, 5, 7, 9, 11, 13, 15, 17 and 18 are cross-sectional views illustrating intermediate stages in the formation of the semiconductor device 100a, in accordance with some embodiments. It should be noted that FIGS. 3, 5, 7, 9, 11, 13, 15 and 17 are cross-sectional views along the sectional line A-A' of FIGS. 2, 4, 6, 8, 10, 12, 14 and 16, respectively.

Figure 2:
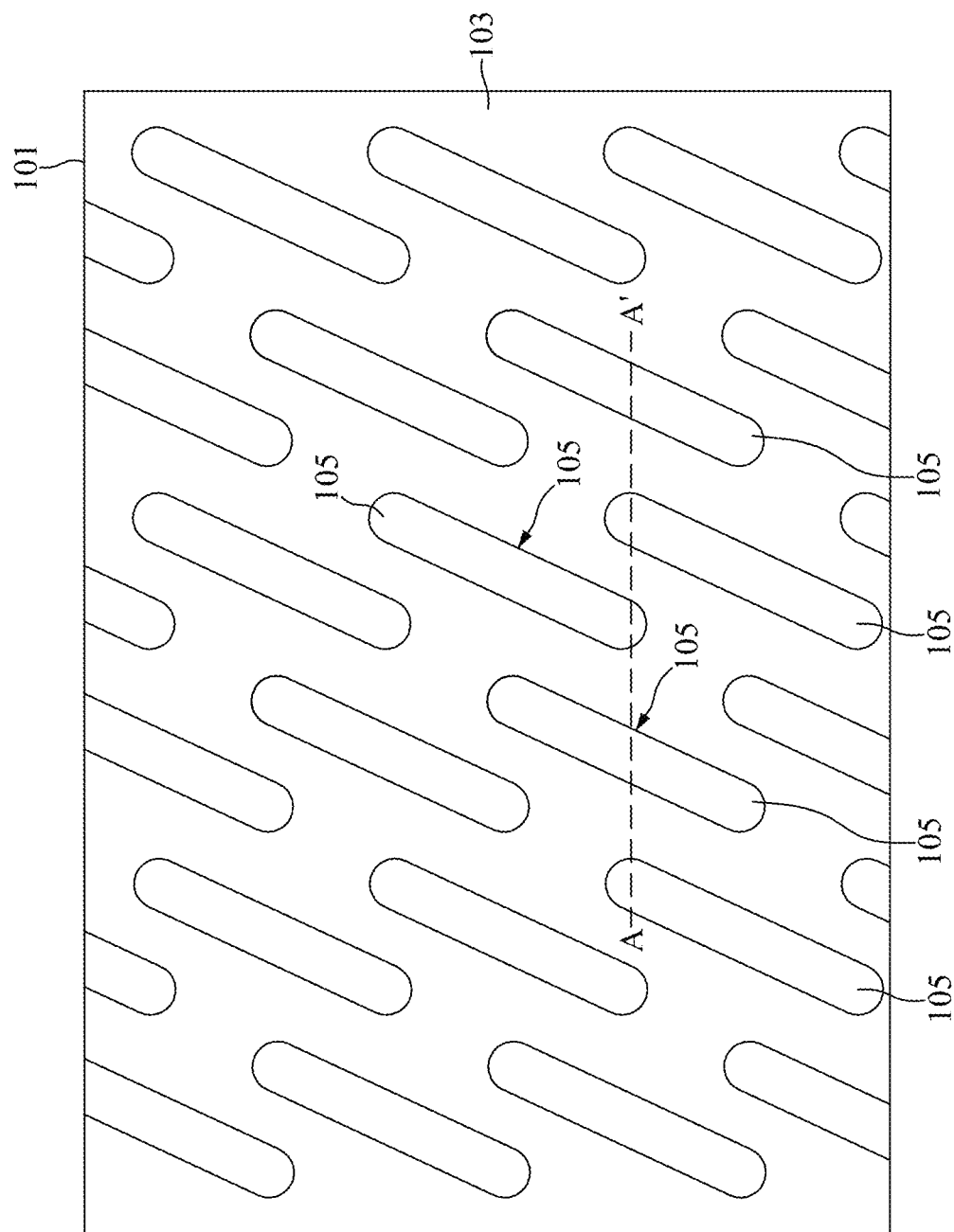
FIG. 2 is a top view illustrating an intermediate stage of forming an isolation structure in a semiconductor substrate during the formation of the semiconductor device, in accordance with some embodiments.
Figure 3:
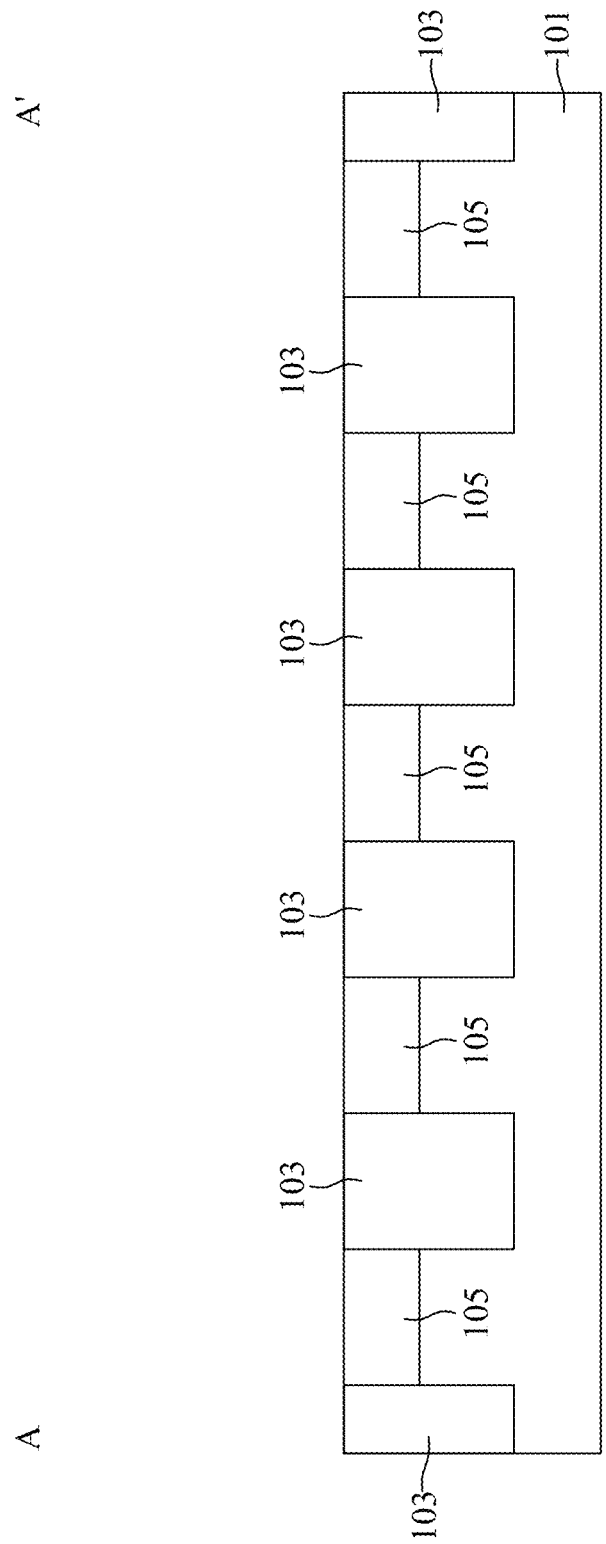
FIG. 3 is a cross-sectional view illustrating an intermediate stage during the formation of the semiconductor device along the sectional line A-A' of FIG. 2, in accordance with some embodiments.

As shown in FIGS. 2 and 3, a semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other applicable methods.

Still referring to FIGS. 2 and 3, an isolation structure 103 is formed in the semiconductor substrate 101 to define active areas, and the isolation structure 103 is a shallow trench isolation (STI) structure, in accordance with some embodiments. The isolation structure 103 may be made of silicon oxide, silicon nitride, silicon oxynitride or another applicable dielectric material, and the formation of the isolation structure 103 may include forming a patterned mask (not shown) over the semiconductor substrate 101, etching the semiconductor substrate 101 to form an opening (not shown) by using the patterned mask as a mask, depositing a dielectric material in the opening and over the semiconductor substrate 101, and planarizing the dielectric material until the semiconductor substrate 101 is exposed.

Moreover, doped regions 105 are formed in the active areas defined by the isolation structure 103. In some embodiments, the doped regions 105 are formed by one or more ion implantation processes, and P-type dopants, such as boron (B), gallium (Ga), or indium (In), or N-type dopants, such as phosphorous (P) or arsenic (As), can be implanted in the active areas to form the doped regions 105, depending on the conductivity type of the semiconductor device 100a. In addition, the doped regions 105 will become the source/drain regions of the semiconductor device 100a in the subsequent processes.

Figure 4:
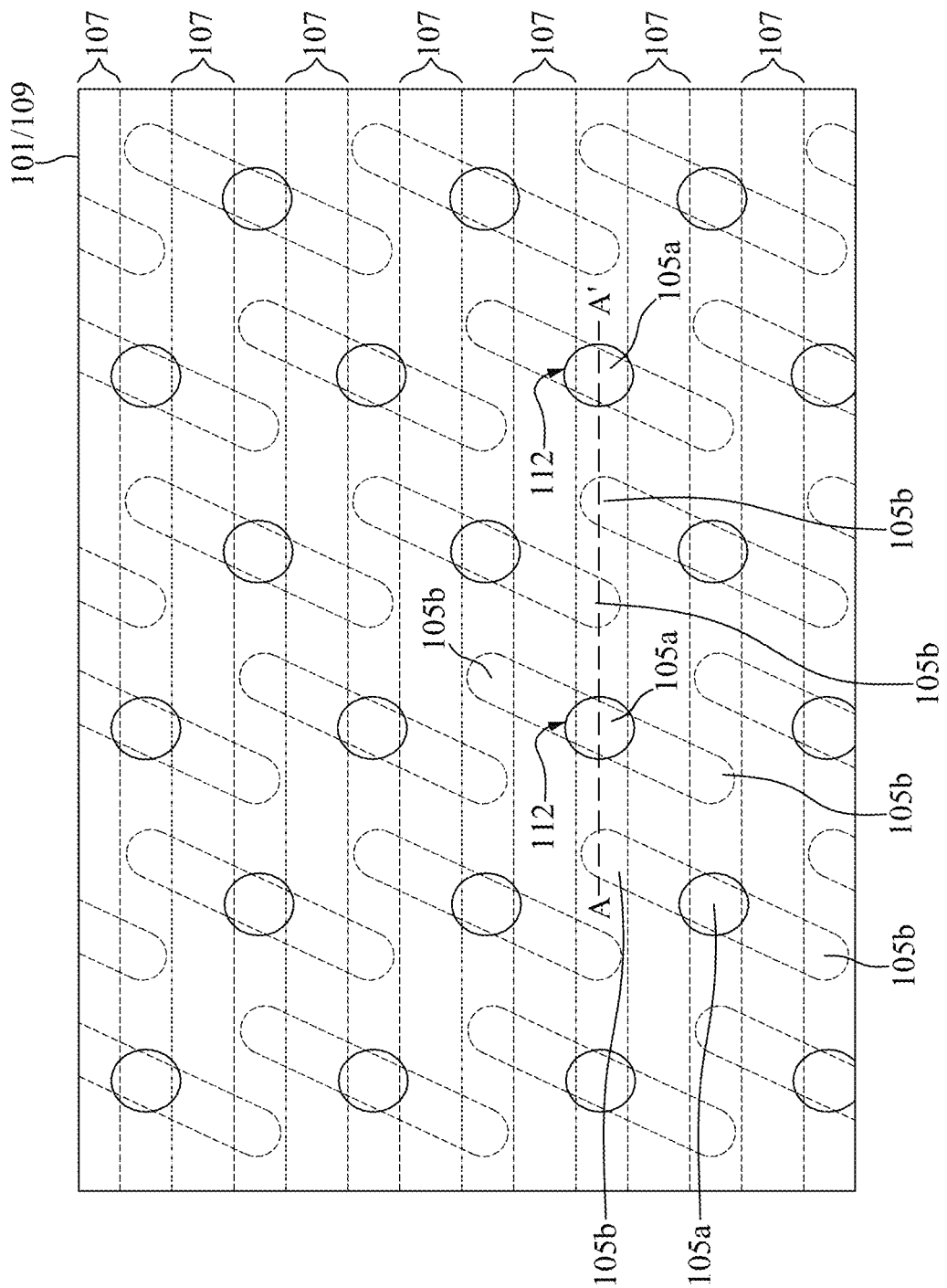
FIG. 4 is a top view illustrating an intermediate stage of etching the semiconductor substrate to form openings during the formation of the semiconductor device, in accordance with some embodiments.
Figure 5:
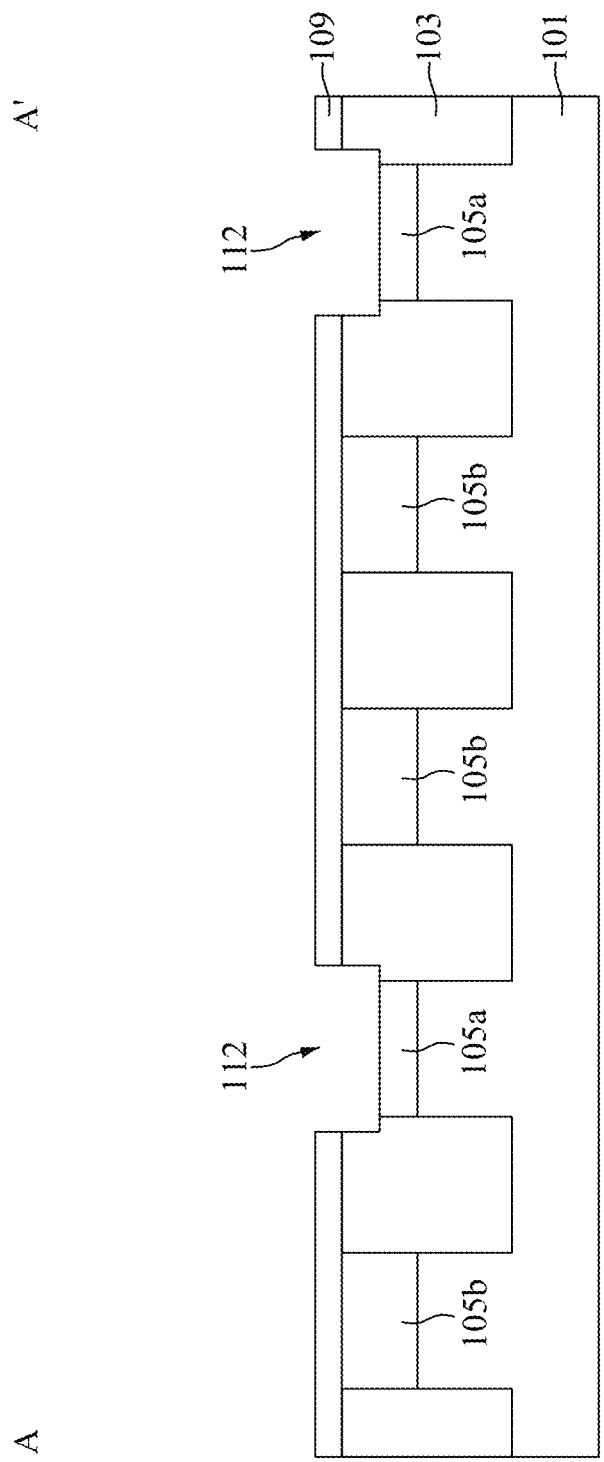
FIG. 5 is a cross-sectional view illustrating an intermediate stage during the formation of the semiconductor device along the sectional line A-A' of FIG. 4, in accordance with some embodiments.

After the doped regions 105 are formed, word line structures 107 are formed penetrating through the doped regions 105 to form source/drain regions 105a and 105b, as shown in FIGS. 4 and 5 in accordance with some embodiments. The respective step is illustrated as the step S11 in the method 10 shown in FIG. 1. In some embodiments, the word line structures 107 are embedded in the semiconductor substrate 101 and arranged parallel to each other.

Each of the word line structures 107 may include a gate dielectric layer (not shown) and a gate electrode (not shown) over the gate dielectric layer. The gate dielectric layers may include silicon oxide, silicon nitride, silicon oxynitride, a dielectric material with high dielectric constant (high-k), or a combination thereof, and the gate electrodes may include a conductive material such as aluminum (Al), copper (Cu), tungsten (W), titanium (Ti), tantalum (Ta), or may be a multi-layer structure including any combination of the above materials. The formation of the word line structures 107 may include etching the semiconductor substrate 101 to form trenches, and performing one or more deposition and etching processes to form the word line structures 107 in the trenches.

Moreover, in the present embodiment, each of the active areas is penetrated by two parallel word line structures 107, as shown in FIG. 4. In some embodiments, the source/drain regions 105b are located at opposite end portions of the active areas, and the source/drain regions 105a are located at middle portions of the active areas. Still referring to FIGS. 4 and 5, after the source/drain regions 105a, 105b and the word line structures 107 are formed, a buffer layer 109 is formed over the semiconductor substrate 101, and openings 112 (i.e., bit line contact openings) are formed in the semiconductor substrate 101 and over the source/drain regions 105a, in accordance with some embodiments.

The buffer layer 109 may include one or more insulating layers. For example, the buffer layer 109 may include at least one or two of a silicon oxide layer, a silicon nitride layer, or a silicon oxynitride layer. The formation of the openings 112 may include forming a patterned mask (not shown) over the buffer layer 109, and etching the buffer layer 109 and the semiconductor substrate 101 using the patterned mask as a mask. More specifically, upper portions of the source/drain regions 105a are etched to form the openings 112.

Figure 6:
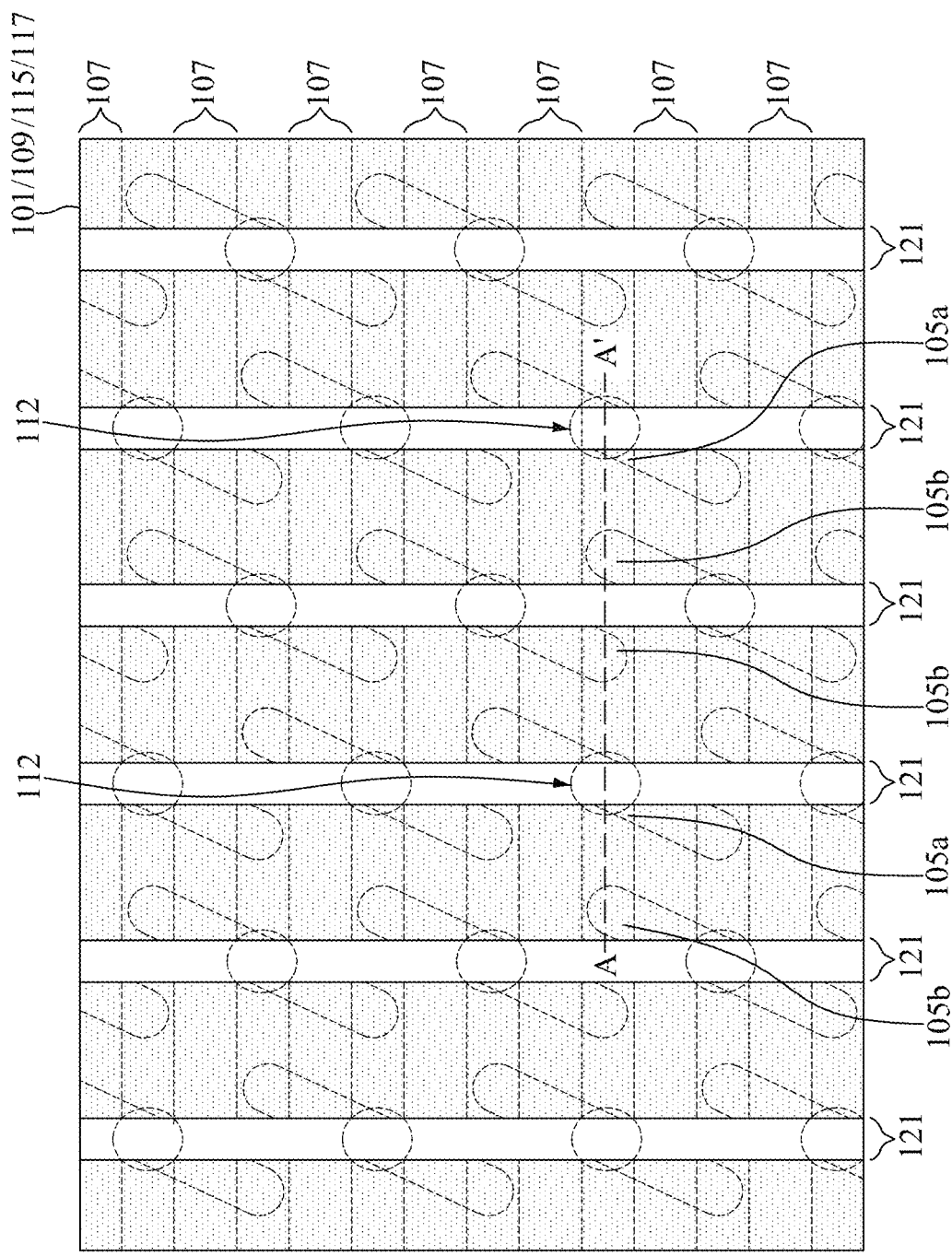
FIG. 6 is a top view illustrating an intermediate stage of sequentially forming a semiconductor layer, a metal layer, and a patterned mask over the semiconductor substrate during the formation of the semiconductor device, in accordance with some embodiments.
Figure 7:
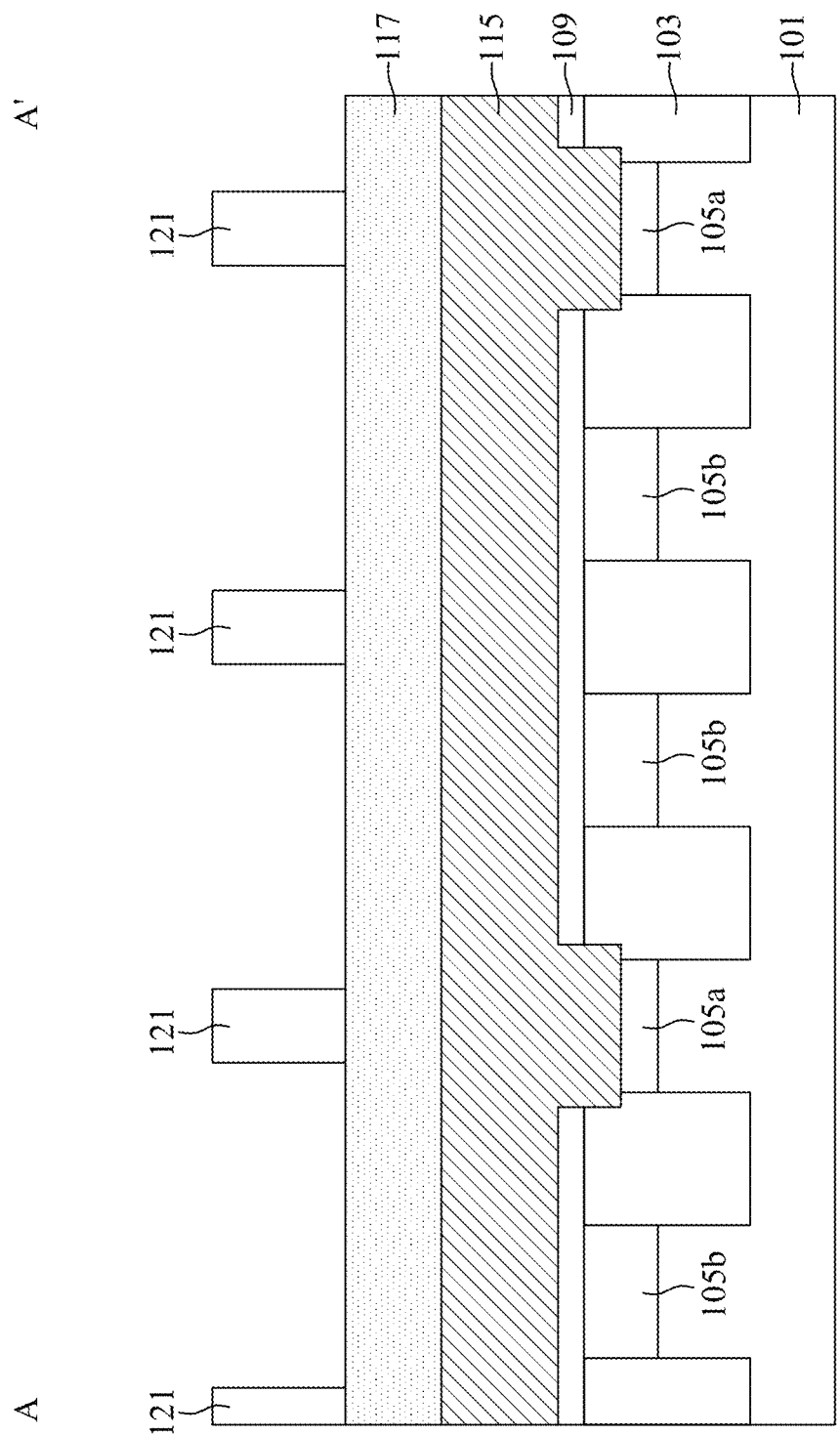
FIG. 7 is a cross-sectional view illustrating an intermediate stage during the formation of the semiconductor device along the sectional line A-A' of FIG. 6, in accordance with some embodiments.

Next, a semiconductor layer 115 is formed over the buffer layer 109, a metal layer 117 is formed over the semiconductor layer 115, and a patterned mask 121 is formed over the metal layer 117, as shown in FIGS. 6 and 7 in accordance with some embodiments. In some embodiments, the openings 112 are filled by the semiconductor layer 115. In some embodiments, the semiconductor layer 115 includes doped polysilicon. In some other embodiments, the semiconductor layer 115 includes metal, metal silicide, metal compound, or a combination thereof. The semiconductor layer 115 may be formed by a deposition process, such as a chemical vapor deposition (CVD) process, a physical vapor deposition (PVD) process, or an atomic layer deposition (ALD) process. In some embodiments, the metal layer 117 includes one or more metals, such as tungsten (W). In addition, the metal layer 117 may be formed by a CVD process, a PVD process, an ALD process, a metal organic CVD (MOCVD) process, a sputtering process, a plating process, or a combination thereof.

Figure 8:
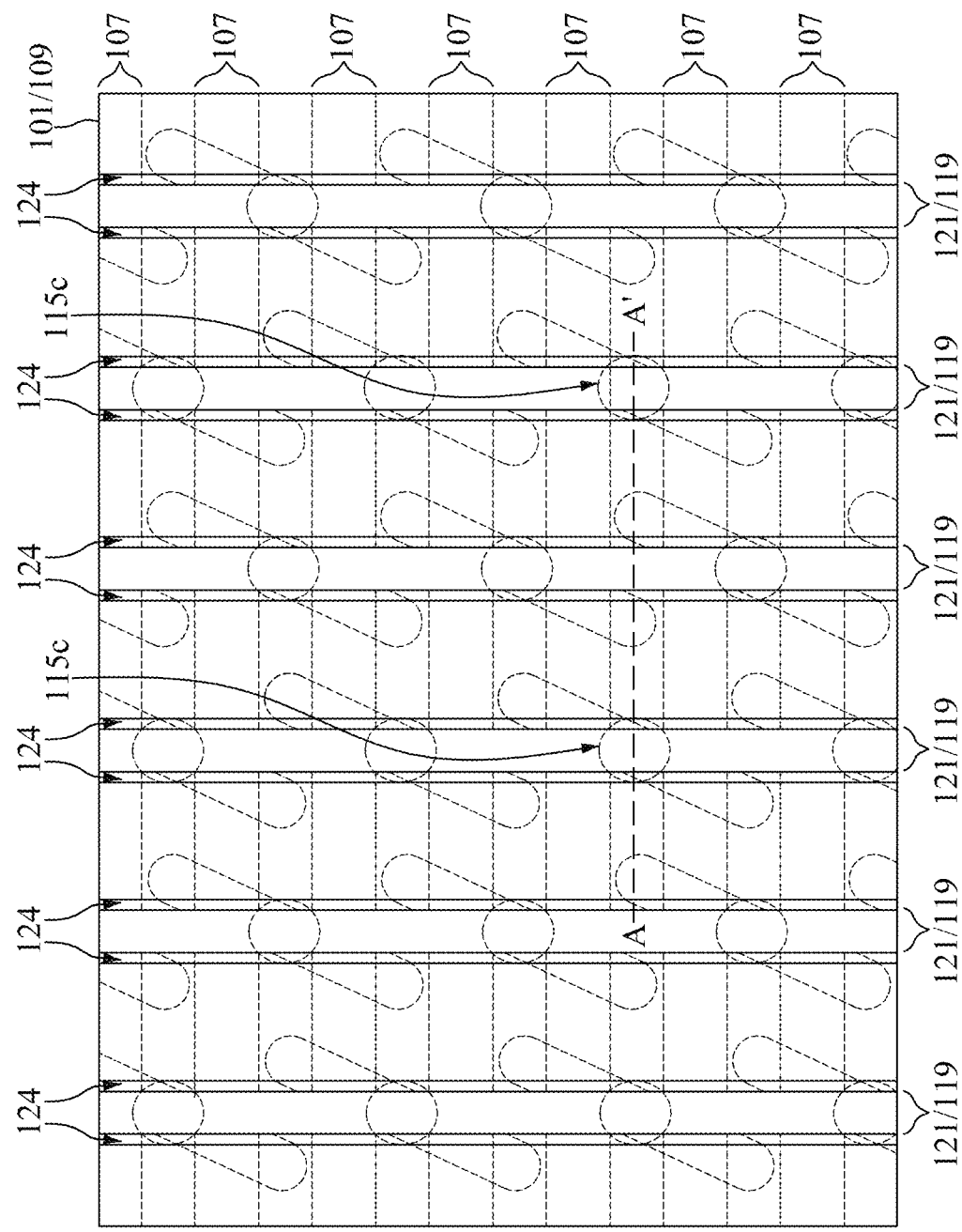
FIG. 8 is a top view illustrating an intermediate stage of etching the semiconductor layer and the metal layer to form bit line structures during the formation of the semiconductor device, in accordance with some embodiments.
Figure 9:
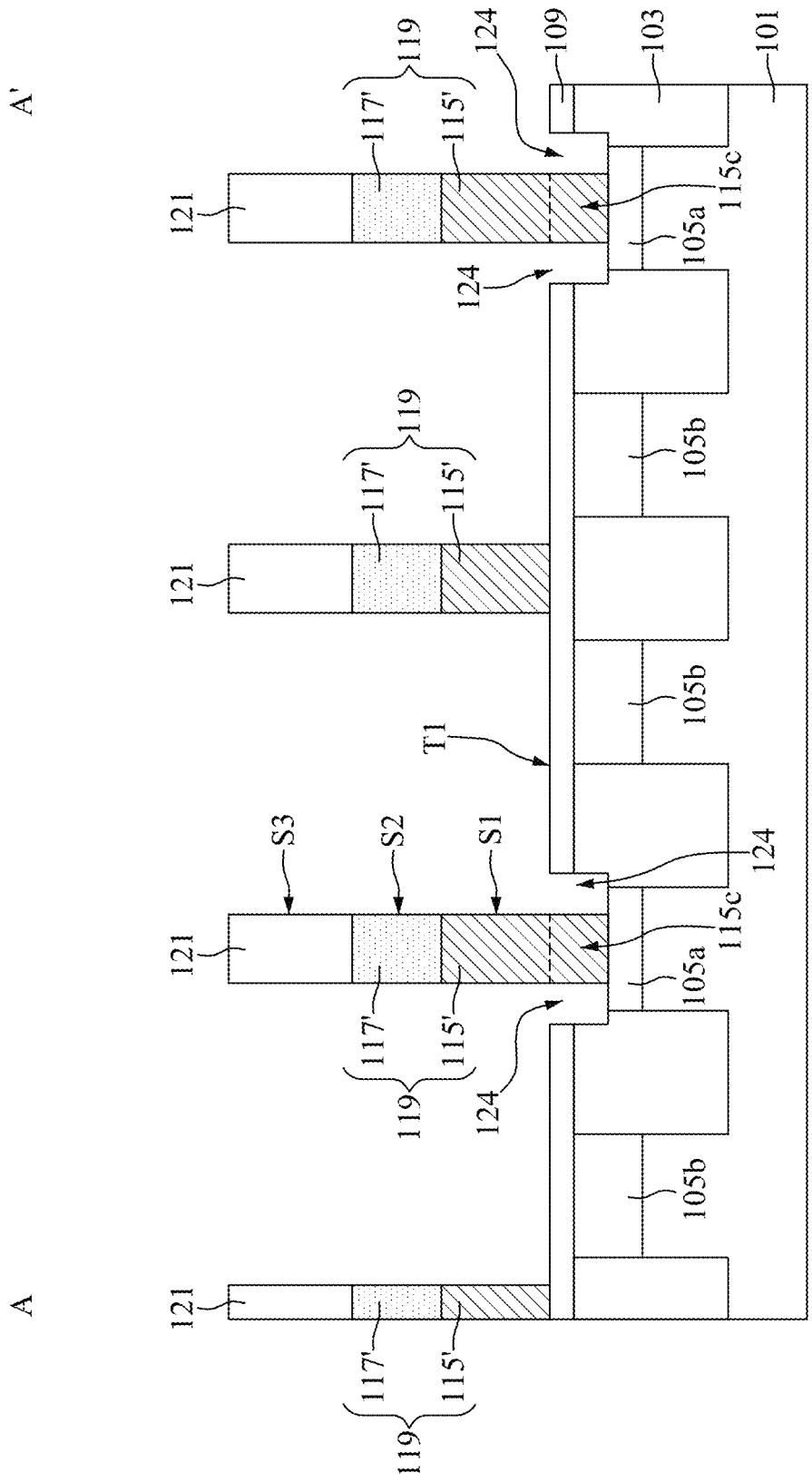
FIG. 9 is a cross-sectional view illustrating an intermediate stage during the formation of the semiconductor device along the sectional line A-A' of FIG. 8, in accordance with some embodiments.

Then, the metal layer 117 and the semiconductor layer 115 are etched using the patterned mask 121 as a mask to form bit line structures 119 over the semiconductor substrate 101, as shown in FIGS. 8 and 9 in accordance with some embodiments. The respective step is illustrated as the step S13 in the method 10 shown in FIG. 1. Each of the bit line structures 119 includes a semiconductor pattern 115' and a metal pattern 117'. The etching process may include a dry etching process, a wet etching process, or a combination thereof.

In some embodiments, the portions of the semiconductor layer 115 filled in the openings 112 (see FIGS. 4 and 5) are etched to form gaps 124 alongside of the bit line structures 119, and the portions of the semiconductor patterns 115' remain in the openings 112 (below the top surface T1 of the buffer layer 109) are referred to as bit line contacts 115c. The dashed lines indicating the boundaries of the bit line contacts 115c and the bit line structures 119 are used to clarify the disclosure. No obvious interfaces exist between the bit line contacts 115c and the bit line structures 119.

In some embodiments, the source/drain regions 105a are partially exposed by the gaps 124, and the gaps 124 are located within the openings 112. Moreover, sidewalls S1 of the semiconductor patterns 115', sidewalls S2 of the metal patterns S2, and sidewalls S3 of the patterned mask 121 are substantially aligned after the etching process. Within the context of this disclosure, the word "substantially" means preferably at least 90%, more preferably 95%, even more preferably 98%, and most preferably 99%.

Figure 10:
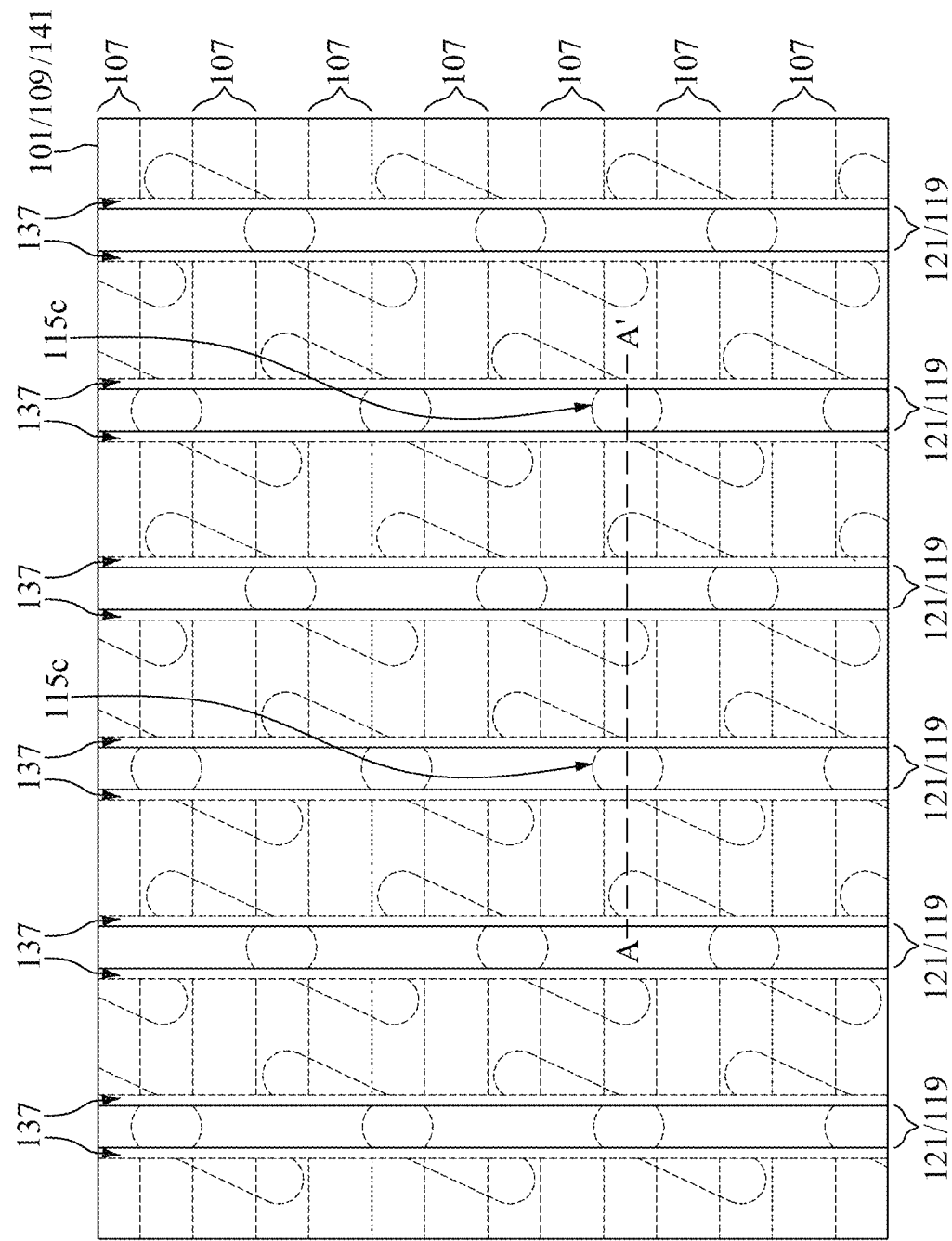
FIG. 10 is a top view illustrating an intermediate stage of forming first spacer structures on sidewalls of the bit line structures during the formation of the semiconductor device, in accordance with some embodiments.
Figure 11:
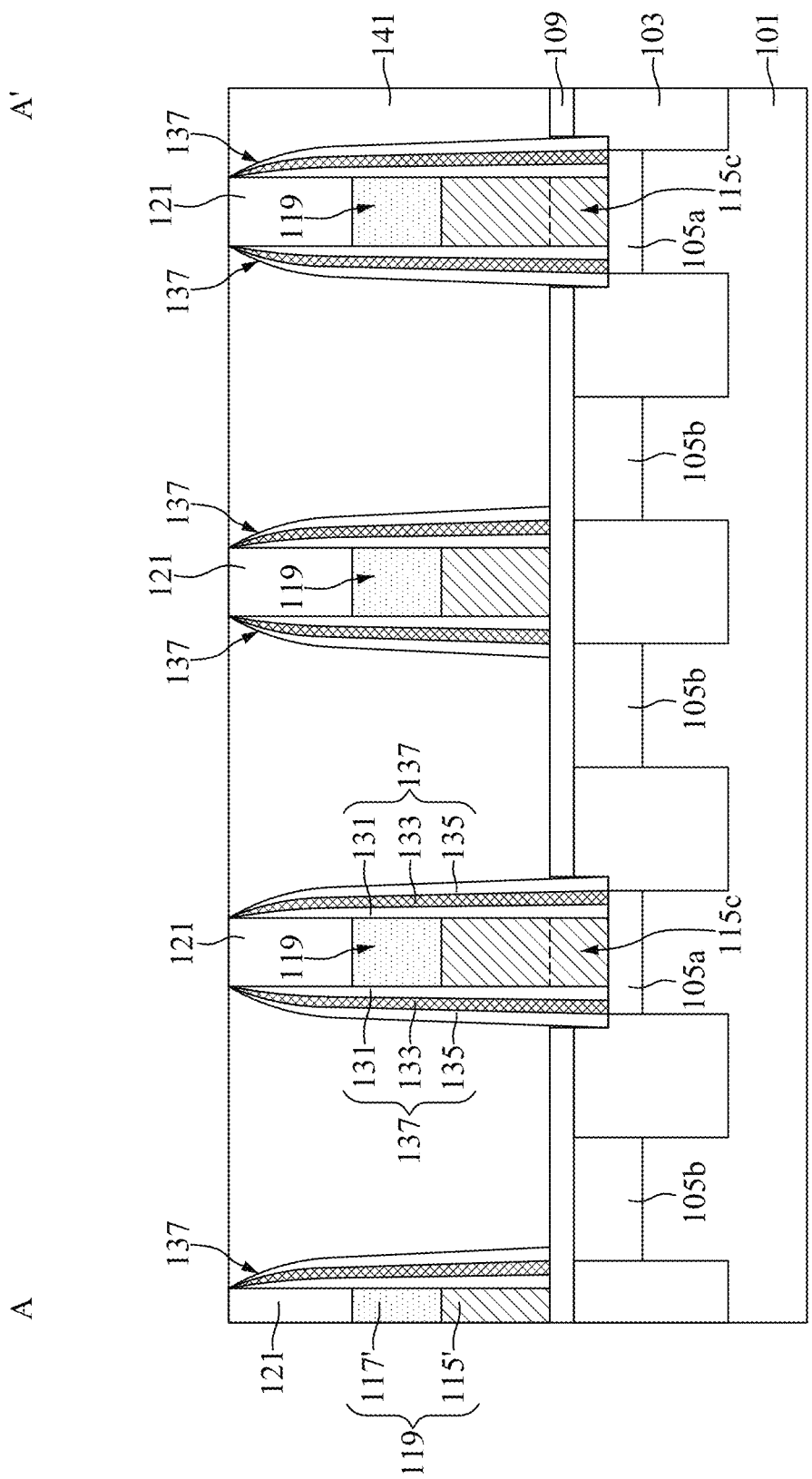
FIG. 11 is a cross-sectional view illustrating an intermediate stage during the formation of the semiconductor device along the sectional line A-A' of FIG. 10, in accordance with some embodiments.

Subsequently, first spacer structures 137 are formed on the sidewalls of the bit line structures 119 (including the sidewalls S1 of the semiconductor patterns 115' and the sidewalls S2 of the metal patterns 117') and on the sidewalls S3 of the patterned mask 121, as shown in FIGS. 10 and 11 in accordance with some embodiments. The respective step is illustrated as the step S15 in the method 10 shown in FIG. 1. In some embodiments, the gaps 124 (see FIGS. 8 and 9) are filled by the first spacer structures 137.

In some embodiments, each of the first spacer structures 137 includes an inner spacer 131 contacting the bit line structures 119 and the patterned mask 121, a middle spacer 133, and an outer spacer 135 separating from the inner spacer 131 by the middle spacer 133. In some embodiments, the inner spacers 131 and the outer spacers 135 are made of high density carbon, silicon carbide (SiC), silicon carbon nitride (SiCN), doped oxide, or another applicable dielectric material, although any other materials may alternatively be utilized. In some embodiments, the middle spacers 133 are made of an energy removable material.

In some embodiments, the energy removable material of the middle spacers 133 includes a base material and a decomposable porogen material that is substantially removed once being exposed to an energy source (e.g., heat). In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can provide porosity to the spaces originally occupied by the middle spacers 133 in the subsequent processes.

In some embodiments, the formation of the inner spacers 131 includes conformally depositing an inner spacer material (not shown) over the structure of FIGS. 8 and 9. The deposition process may include a CVD process, a PVD process, an ALD process, a spin-on coating process, or another applicable process. Then, the inner spacer material may be etched by an anisotropic etching process, which removes the same amount of the spacer material vertically in all places, leaving the inner spacers 131 on the sidewalls S1, S2 of the bit line structures 119 and on the sidewalls S3 of the patterned mask 121. In some embodiments, the etching process is a dry etching process. Some processes used to form the middle spacers 133 and the outer spacers 135 are similar to, or the same as those used to form the inner spacers 131, and details thereof are not repeated herein.

After the first spacer structures 137 are formed, a first dielectric layer 141 is formed to fill the spaces between the first spacer structures 137 and over the source/drain regions 105b, as shown in FIGS. 10 and 11 in accordance with some embodiments. The first dielectric layer 141 may be made of a low-k dielectric material. In some embodiments, the low-k dielectric material has a dielectric constant (k value) less than about 4. Examples of the low-k dielectric material include, but not limited to, silicon oxide, silicon nitride, silicon oxynitride (SiON), silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide. The dielectric layer 141 may be formed by a deposition process. After the dielectric layer 141 is deposited, a planarization process may be performed until the patterned mask 121 is exposed. The planarization process may be a chemical mechanical polishing (CMP) process.

Figure 12:
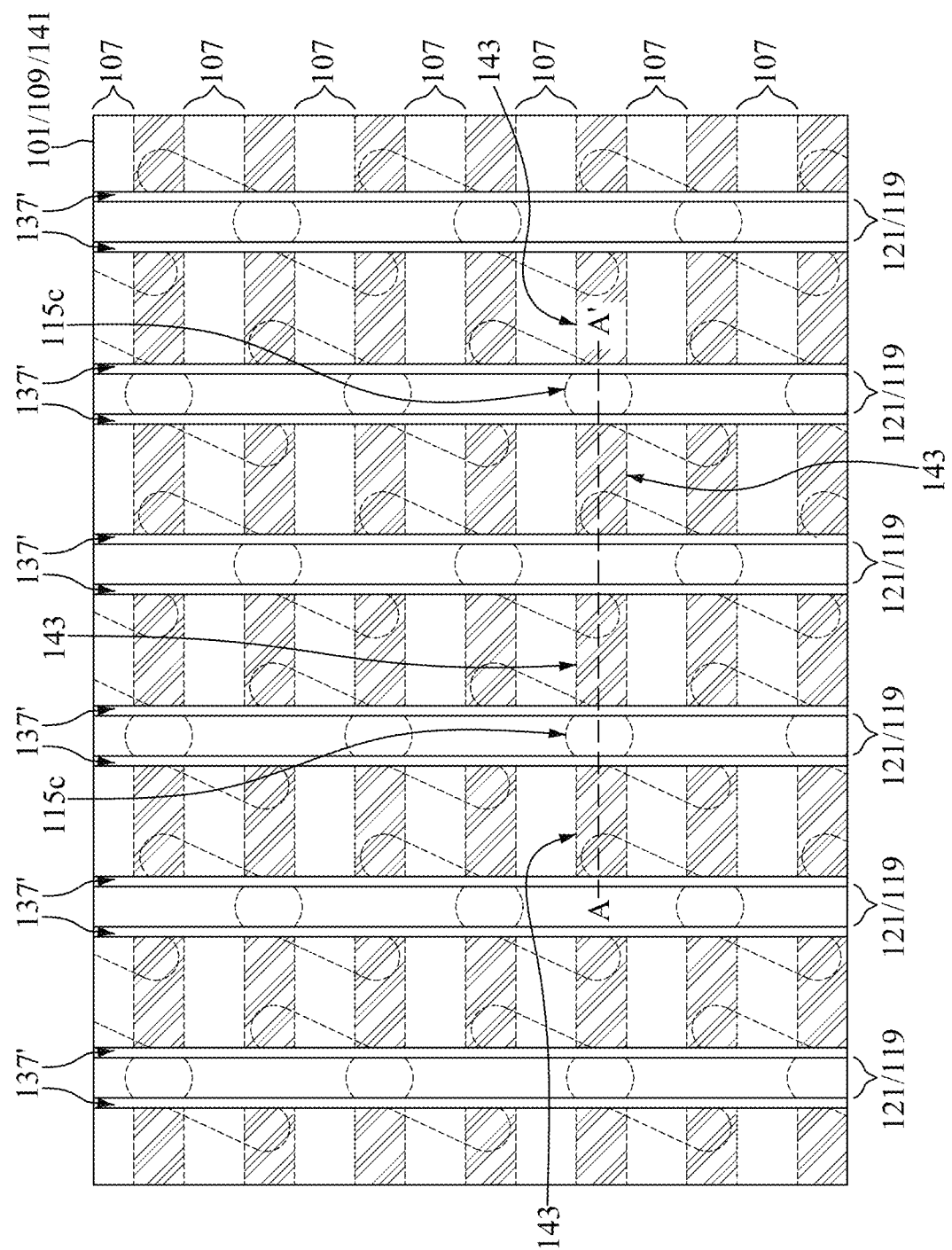
FIG. 12 is a top view illustrating an intermediate stage of forming capacitor contacts adjacent to the first spacer structures during the formation of the semiconductor device, in accordance with some embodiments.
Figure 13:
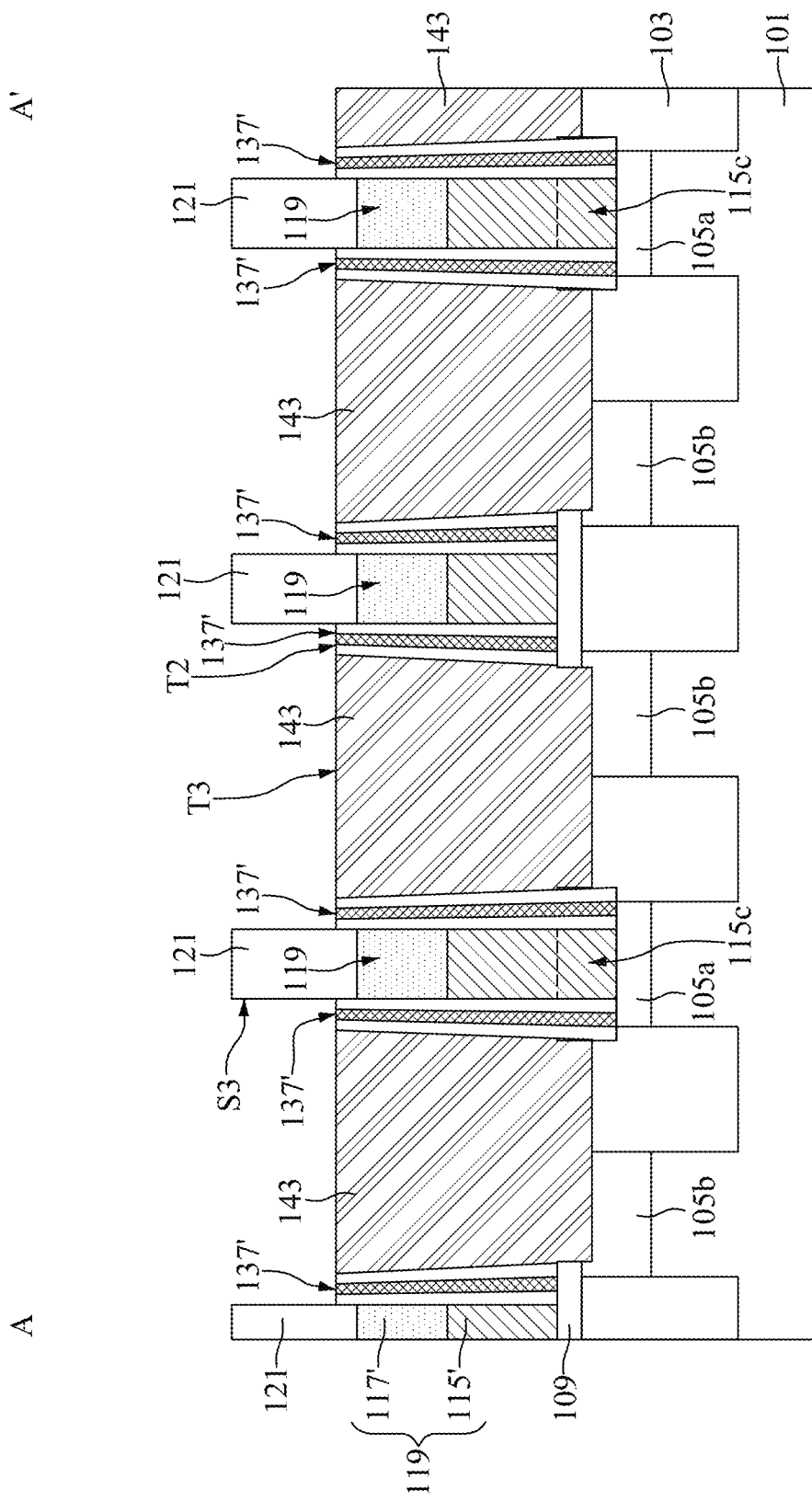
FIG. 13 is a cross-sectional view illustrating an intermediate stage during the formation of the semiconductor device along the sectional line A-A' of FIG. 12, in accordance with some embodiments.

Next, openings (not shown) are formed penetrating through the first dielectric layer 141 and the barrier layer 109 such that the source/drain regions 105b are exposed, and capacitor contacts 143 are formed in the openings, as shown in FIGS. 12 and 13 in accordance with some embodiments. The respective step is illustrated as the step S17 in the method 10 shown in FIG. 1. In some embodiments, the openings exposing the source/drain regions 105b are formed by a dry etching process, and the capacitor contacts 143 are formed by a deposition process and a subsequent etch-back process.

Specifically, the formation of the capacitor contacts 143 includes depositing a conductive material (not shown) in the openings exposing the source/drain regions 105b, and performing an etch-back process on the conductive material to form the capacitor contacts 143. In some embodiments, the first spacer structures 137 are partially etched during the etch-back process for forming the capacitor contacts 143, such that the top surfaces T2 of the etched first spacer structures 137' are substantially coplanar with the top surfaces T3 of the capacitor contacts 143. In addition, in some embodiments, the etched first spacer structures 137' are in direct contact with the capacitor contacts 143. The capacitor contacts 143 may include copper (Cu), tungsten (W), aluminum (Al), titanium (Ti), tantalum (Ta), gold (Au), silver (Ag), a combination thereof, or another applicable conductive material.

Figure 14:
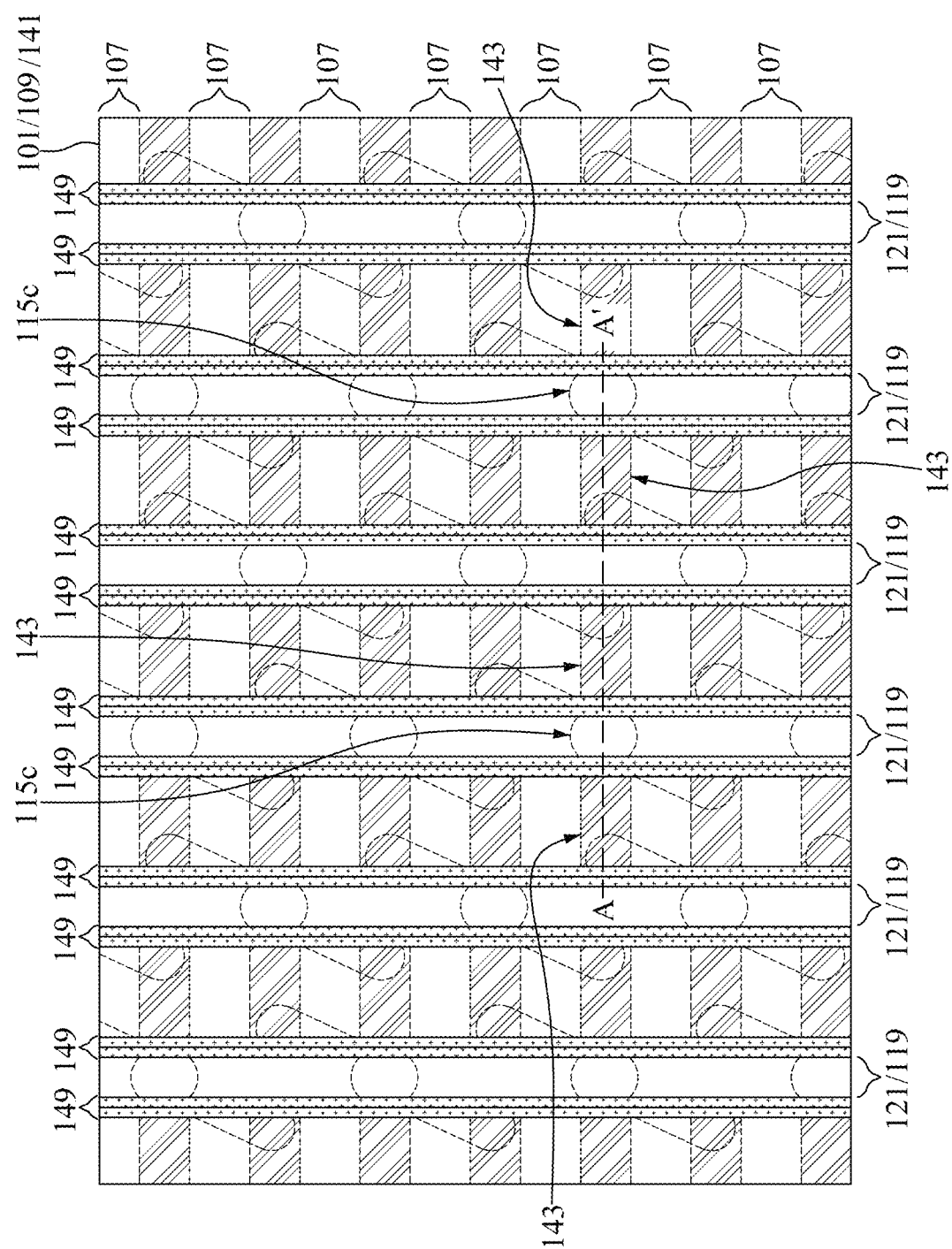
FIG. 14 is a top view illustrating an intermediate stage of forming second spacer structures over the first spacer structures during the formation of the semiconductor device, in accordance with some embodiments.
Figure 15:
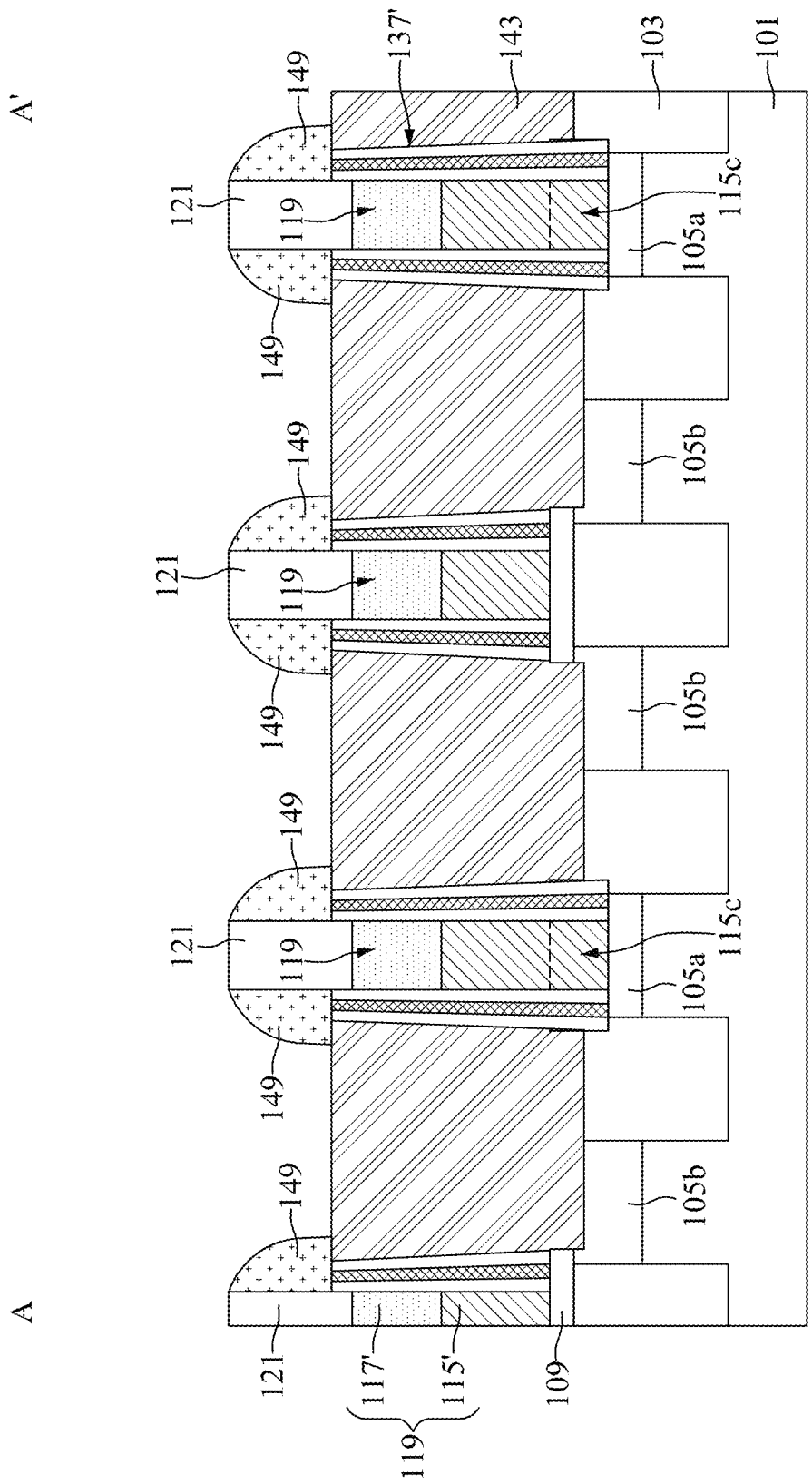
FIG. 15 is a cross-sectional view illustrating an intermediate stage during the formation of the semiconductor device along the sectional line A-A' of FIG. 14, in accordance with some embodiments.

Then, second spacer structures 149 are formed over the etched first spacer structures 137' as shown in FIGS. 14 and 15 in accordance with some embodiments. The respective step is illustrated as the step S21 in the method 10 shown in FIG. 1 (the step S19 is skipped). In some embodiments, the second spacer structures 149 are formed on the sidewalls S3 (see FIG. 13) of the patterned mask 121. Specifically, the second spacer structures 149 are in direct contact with the top surfaces T2 of the first spacer structures 137', the top surfaces T3 of the capacitor contacts 143, and the sidewalls S3 of the patterned mask 121, in accordance with some embodiments. Some materials and processes used to form the second spacer structures 149 are similar to, or the same as those used to form the inner spacers 131 of the first spacer structures 137, and details thereof are not repeated herein.

Figure 16:
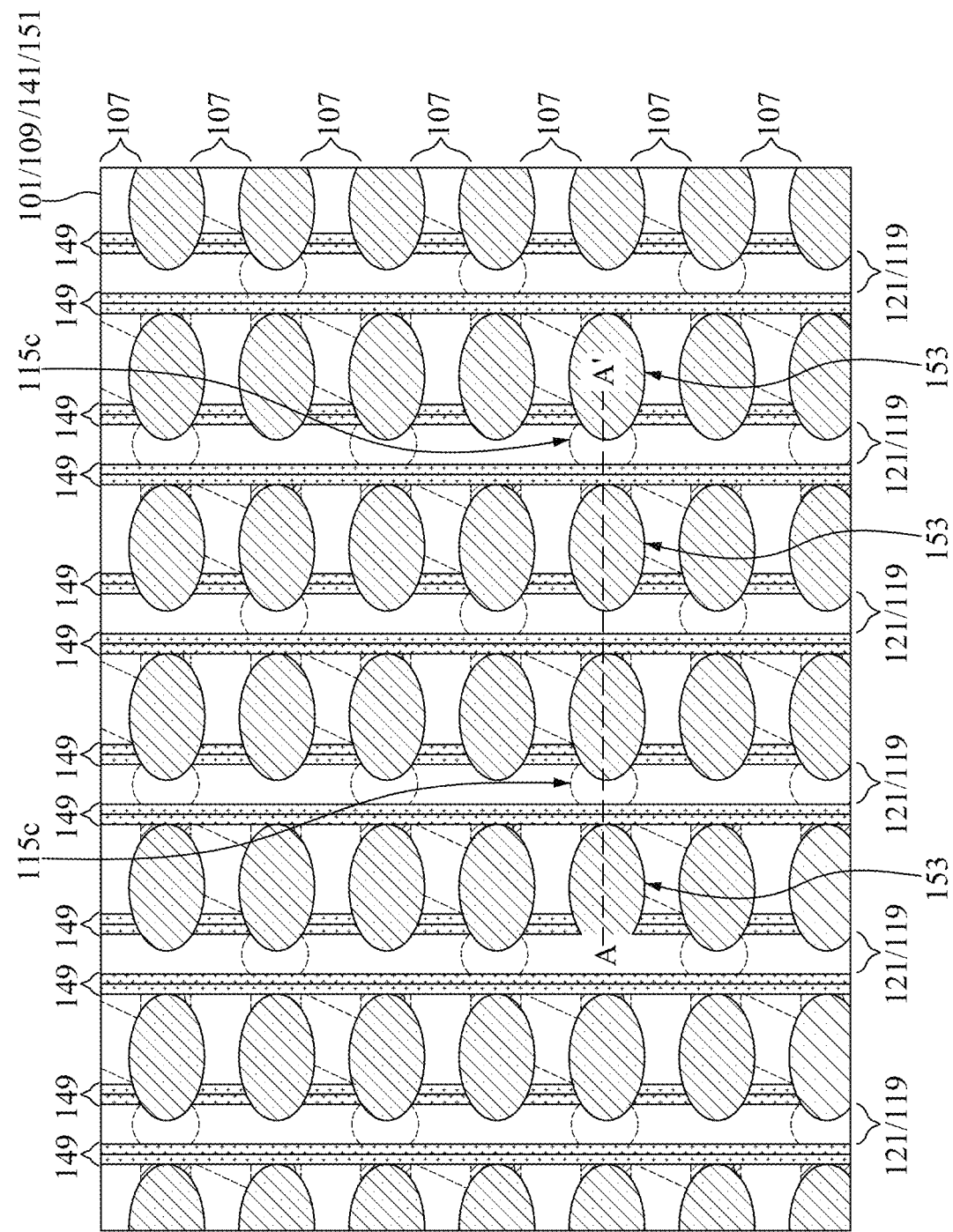
FIG. 16 is a top view illustrating an intermediate stage of forming conductive pads over the capacitor contacts during the formation of the semiconductor device, in accordance with some embodiments.
Figure 17:
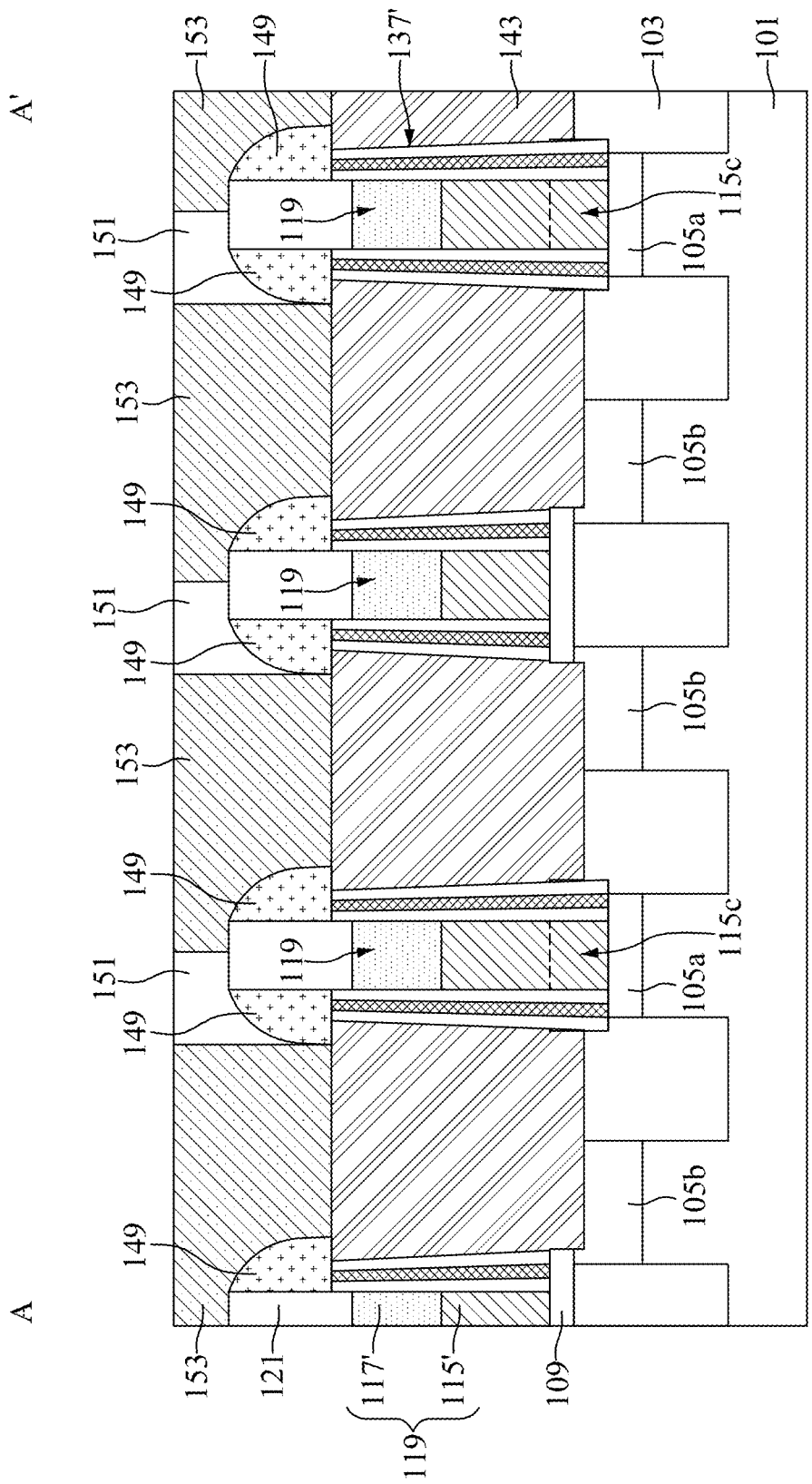
FIG. 17 is a cross-sectional view illustrating an intermediate stage during the formation of the semiconductor device along the sectional line A-A' of FIG. 16, in accordance with some embodiments.

Subsequently, a second dielectric layer 151 is formed over the structure of FIGS. 14 and 15, as shown in FIGS. 16 and 17 in accordance with some embodiments. After the second dielectric layer 151 is formed, openings (not shown) are formed penetrating through the second dielectric layer 151 such that the capacitor contacts 143 are exposed, and conductive pads 153 are formed in the openings. The respective step is illustrated as the step S23 in the method 10 shown in FIG. 1. In some embodiments, the second spacer structures 149 are covered by the conductive pads 153. In some embodiments, the second spacer structures 149 extend to cover portions of the patterned mask 121.

Some materials and processes used to form the second dielectric layer 151 are similar to, or the same as those used to form the first dielectric layer 141 (see FIGS. 10 and 11), and details thereof are not repeated herein. In some embodiments, the openings exposing the capacitor contacts 143 are formed by a dry etching process, and the conductive pads 153 are formed by a deposition process and a subsequent planarization process. The conductive pads 153 may include copper (Cu), tungsten (W), aluminum (Al), titanium (Ti), tantalum (Ta), gold (Au), silver (Ag), a combination thereof, or another applicable conductive material.

After the conductive pads 153 are formed, a heat treatment process is performed to transform the middle spacers 133 of the first spacer structures 137' into air gaps 156, as shown in FIG. 18 in accordance with some embodiment. FIG. 18 is a cross-sectional view illustrated along a similar cross-section as shown in FIG. 17. The respective step is illustrated as the step S25 in the method 10 shown in FIG. 1. After the heat treatment process, treated first spacer structures 137" with the air gaps 156 sandwiched between the inner spacers 131 and the outer spacers 135 are obtained.

In some other embodiment, the heat treatment process can be replaced by a light treatment process, an e-beam treatment process, a combination thereof, or another applicable energy treatment process. In some embodiments, the top portions of the air gaps 156 are sealed by the second spacer structures 149. After the air gaps 156 are formed in the first spacer structures 137" between the bit line structures 119 and the capacitor contacts 143, the semiconductor device 100a is obtained. In some embodiments, the semiconductor device 100a is part of a DRAM.

Figure 19:
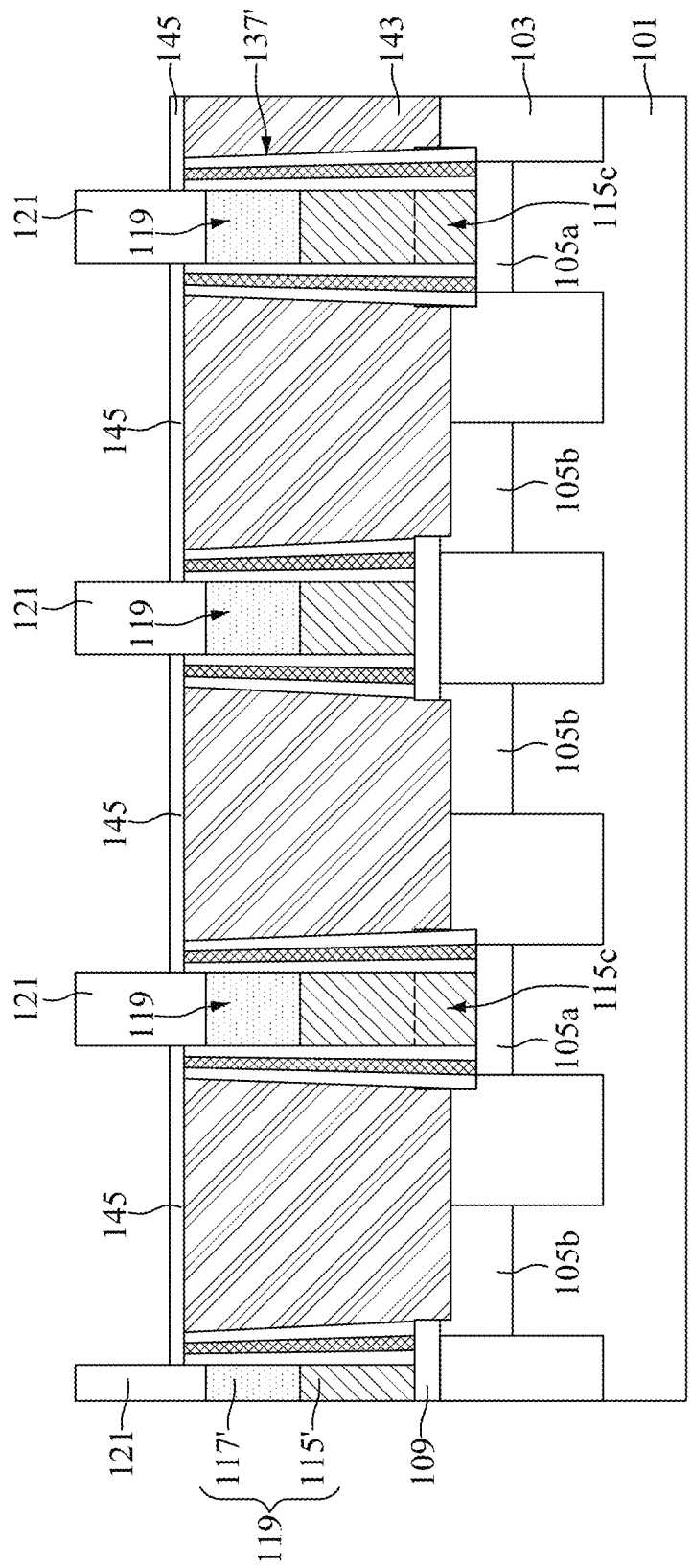
FIG. 19 is a cross-sectional view illustrating an intermediate stage of forming a sealing layer covering the first spacer structures and the capacitor contacts during the formation of a modified semiconductor device, in accordance with some embodiments.

FIGS. 19-23 are cross-sectional views illustrating intermediate stages along a similar cross-section as shown in FIGS. 3, 5, 7, 9, 11, 13, 15, 17 and 18 in the formation of the modified semiconductor device 100b. After the capacitor contacts 143 are formed (i.e., following the step of FIG. 13), a sealing layer 145 is formed over the etched first spacer structures 137' and the capacitor contacts 145, as shown in FIG. 19 in accordance with some embodiments. Specifically, the top surfaces T2 of the first spacer structures 137' and the top surfaces T3 of the capacitor contacts 143 are entirely covered by the sealing layer 145, in accordance with some embodiments.

In some embodiments, the sealing layer 145 includes one or more of silicon (Si), germanium (Ge), gallium (Ga), arsenic (As), indium (In), phosphorus (P), copper (Cu), selenium (Se), titanium (Ti), tantalum (Ta) or tungsten (W). In some embodiments, the sealing layer 145 is formed by a deposition process and a subsequent etch-back process.

Figure 20:
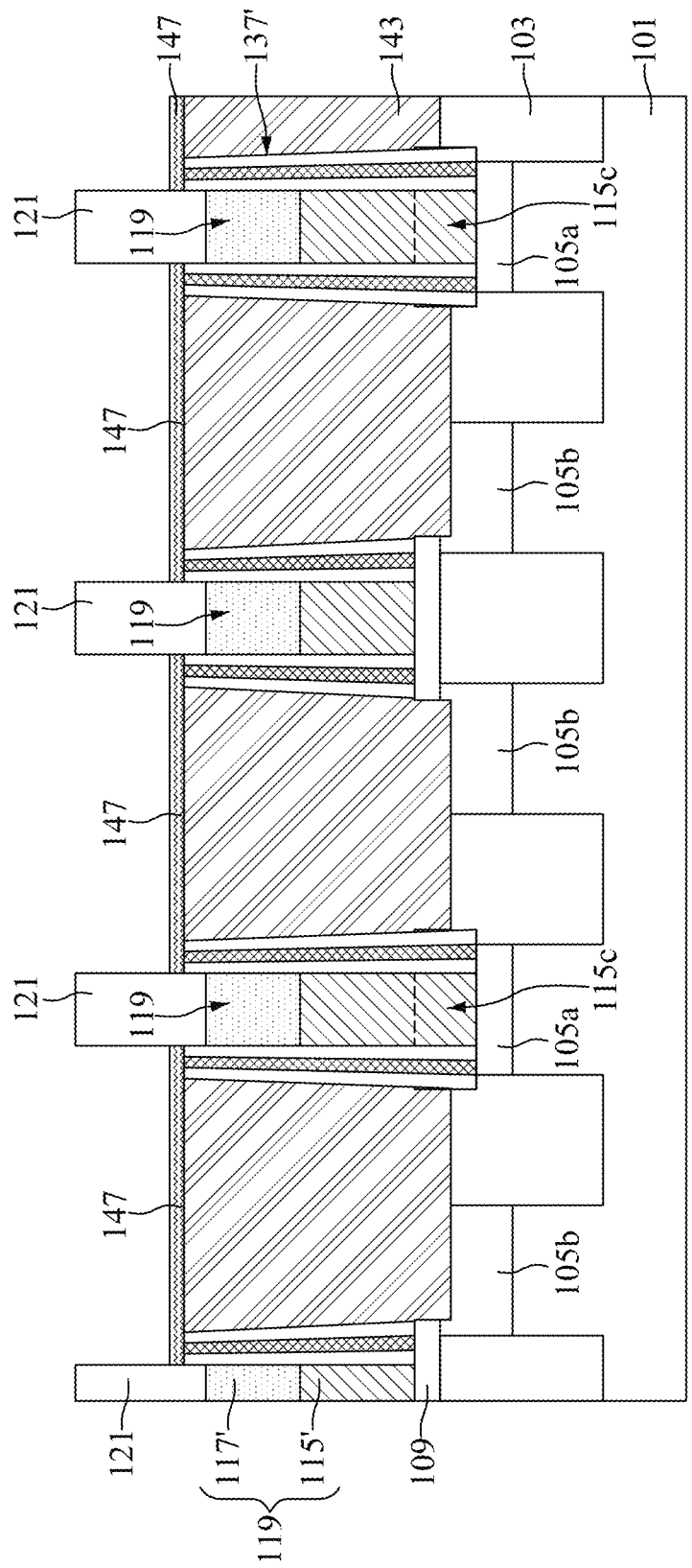
FIG. 20 is a cross-sectional view illustrating an intermediate stage of transforming the sealing layer into a barrier layer during the formation of the modified semiconductor device, in accordance with some embodiments.

Next, an oxidation or nitridation treatment is performed to transform the sealing layer 145 into a barrier layer 147, as shown in FIG. 20 in accordance with some embodiments. In some embodiments, the sealing layer 145 is transformed to the barrier layer 147 by one or more of thermal oxidation treatment, thermal nitridation treatment, plasma oxidation treatment, or plasma nitridation treatment. In other words, the barrier layer 147 includes a nitride, an oxide, or a combination thereof. In some embodiments, a silicon oxide layer is deposited over the barrier layer 147. In some other embodiments, the sealing layer 145 is not formed, and a barrier layer 147 including a high quality silicon oxide layer is directly deposited over the first spacer structures 137' and the capacitor contacts 145. The respective step is illustrated as the step S19 in the method 10 shown in FIG. 1.

Figure 21:
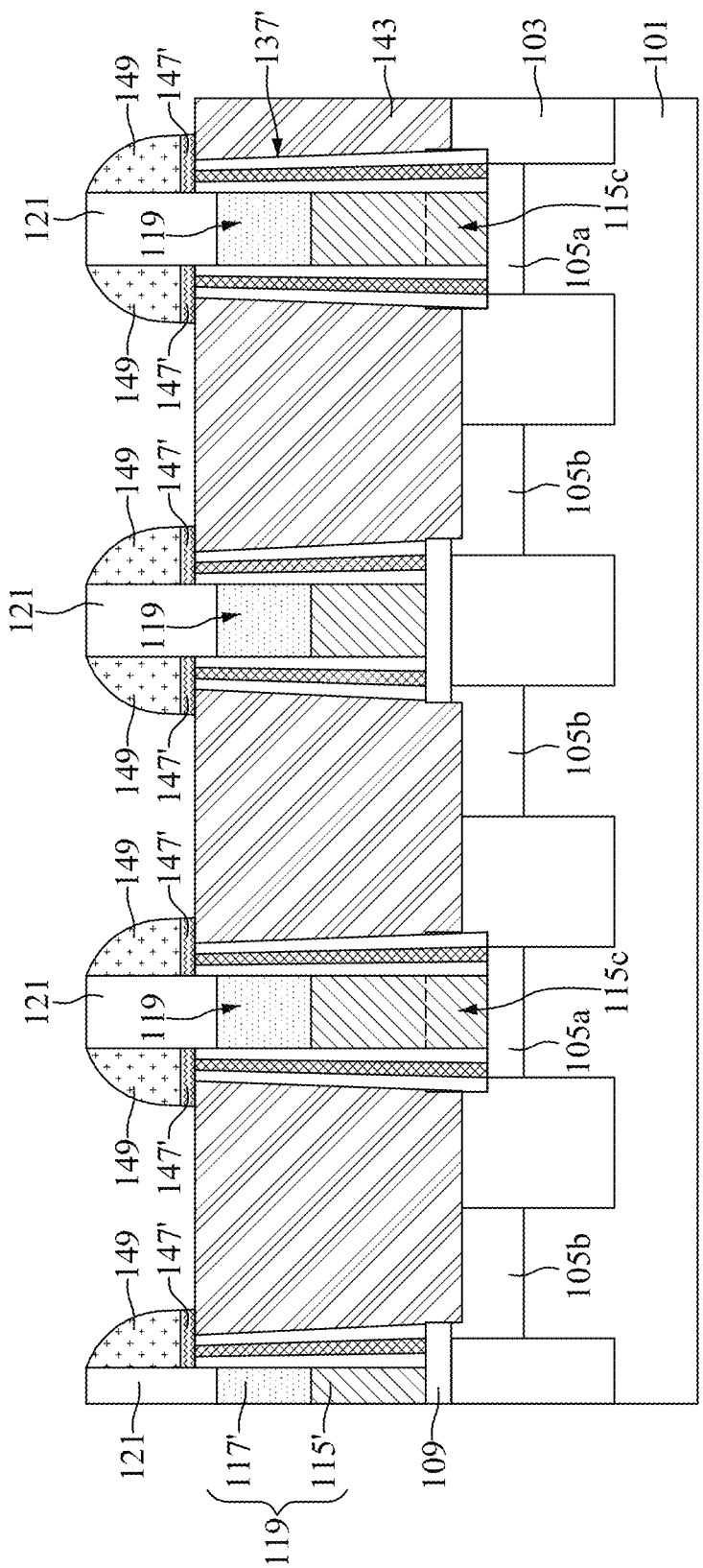
FIG. 21 is a cross-sectional view illustrating an intermediate stage of forming second spacer structures over the barrier layer and etching the barrier layer using the second spacer structures as a mask during the formation of the modified semiconductor device, in accordance with some embodiments.

Similar to the step shown in FIGS. 14 and 15, the second spacer structures 149 is formed over the barrier layer 147, and the barrier layer 147 is etched by using the second spacer structures 149 as a mask, such that barrier portions 147' are formed sandwiched between the first spacers structures 137' and the second spacer structures 147', as shown in FIG. 21 in accordance with some embodiments. The respective step is illustrated as the step S21 in the method 10 shown in FIG. 1. In some embodiments, the barrier layer 147 is etched during the formation of the second spacer structures 149.

Figure 22:
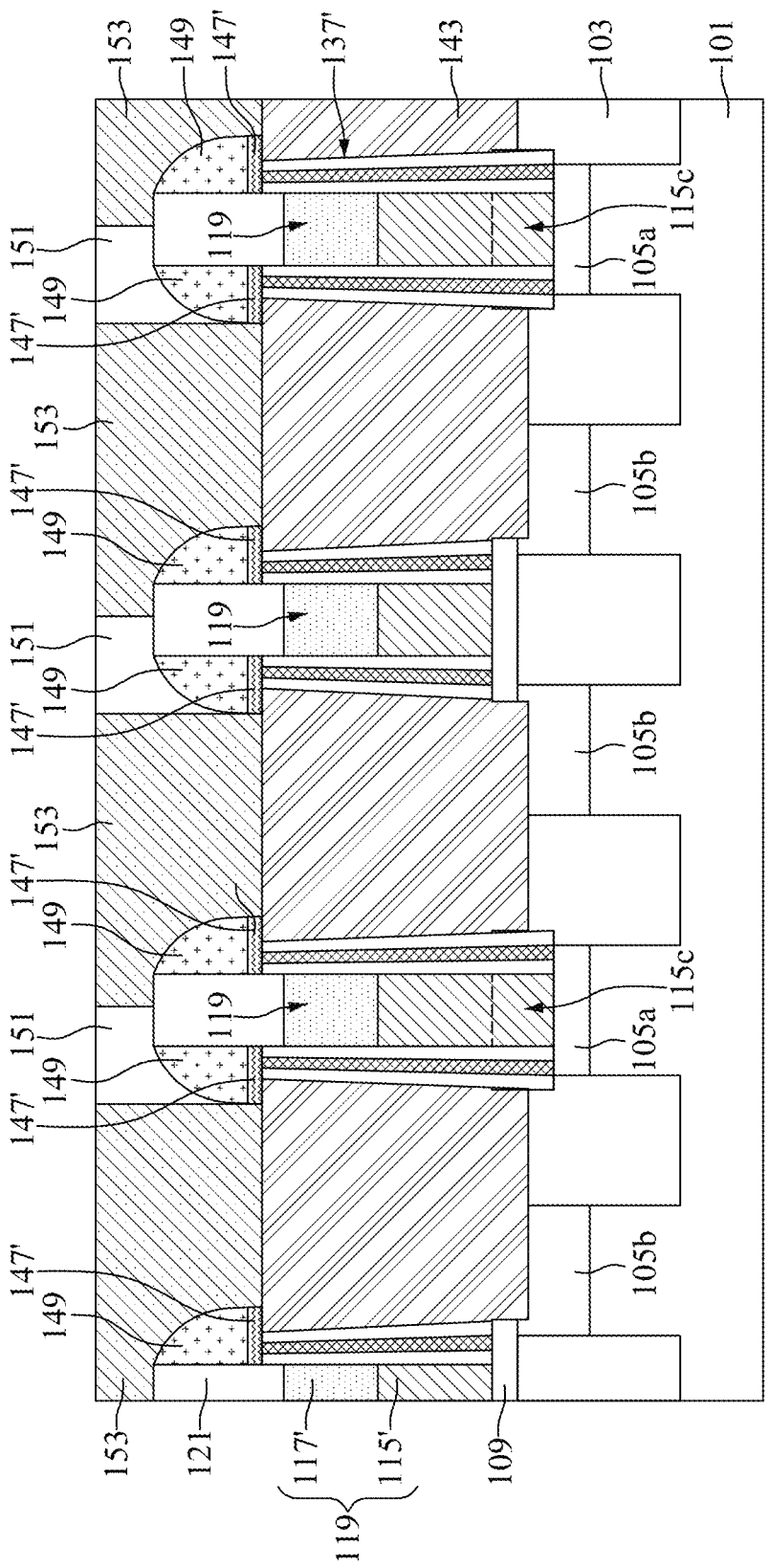
FIG. 22 is a cross-sectional view illustrating an intermediate stage of forming conductive pads over the capacitor contacts during the formation of the modified semiconductor device, in accordance with some embodiments.

Subsequently, similar to the step shown in FIGS. 16 and 17, a second dielectric layer 151 is formed over the second spacer structures 149 and the capacitor contacts 143, and conductive pads 153 are formed penetrating through the second dielectric layer 151 to physically and electrically connect to the capacitor contacts 143, as shown in FIG. 22 in accordance with some embodiments. The respective step is illustrated as the step S23 in the method 10 shown in FIG. 1. It should be noted that the conductive pads 153 are in direct contact with the barrier potions 147'.

After the conductive pads 153 are formed, similar to the step shown in FIG. 18, a heat treatment process is performed to transform the middle spacers 133 of the first spacer structures 137' into air gaps 156, as shown in FIG. 23 in accordance with some embodiment. The respective step is illustrated as the step S25 in the method 10 shown in FIG.

1. After the heat treatment process, treated first spacer structures 137" with the air gaps 156 sandwiched between the inner spacers 131 and the outer spacers 135 are obtained.

In some other embodiment, the heat treatment process can be replaced by a light treatment process, an e-beam treatment process, a combination thereof, or another applicable energy treatment process. In some embodiments, the top portions of the air gaps 156 are sealed by the barrier portions 147'. After the air gaps 156 are formed in the first spacer structures 137" between the bit line structures 119 and the capacitor contacts 143, the semiconductor device 100b is obtained. In some embodiments, the semiconductor device 100b is part of a DRAM.

Embodiments of a semiconductor device and method for forming the same are provided in the disclosure. The method includes forming a first spacer structure on a sidewall of a bit line structure (i.e., a first conductive feature), and forming a capacitor contact (i.e., a second conductive feature) adjacent to the first spacer structure. In some embodiments, the method also includes forming a second spacer structure over the first spacer structure, and performing a heat treatment process to transform a portion of the first spacer structure (e.g., the middle spacer 133) into an air gap. Therefore, the parasitic capacitance between the bit line structure and the capacitor contact may be reduced, and the remaining portions of the first spacer structure (e.g., the inner spacer 131 and the outer spacer 135) may provide additional structural support to the semiconductor device. Moreover, the second spacer structure may prevent undesirable short circuit between the bit line structure and the subsequently formed conductive pad over the capacitor contact. As a result, the overall device performance may be improved, and the yield rate of the semiconductor device may be increased.

In one embodiment of the present disclosure, a method for forming a semiconductor device is provided. The method includes forming a first source/drain region and a second source/drain region in a semiconductor substrate, and forming a first conductive feature over and electrically connected to the first source/drain region. The method also includes forming a first spacer structure on a sidewall of the first conductive feature, and forming a second conductive feature over and electrically connected to the second source/drain region. The second conductive feature is adjacent to the first spacer structure, and the first spacer structure is etched during the forming the second conductive feature. The method further includes forming a second spacer structure over the etched first spacer structure, and performing a heat treatment process to transform a portion of the first spacer structure into an air gap after the second spacer structure is formed.

In another embodiment of the present disclosure, a method for forming a semiconductor device is provided. The method includes forming a first source/drain region and a second source/drain region in a semiconductor substrate, and forming a semiconductor layer over the semiconductor substrate. The method also includes forming a metal layer over the semiconductor layer, and forming a patterned mask over the metal layer. The method further includes etching the semiconductor layer and the metal layer to form a bit line structure using the patterned mask as a mask. The bit line structure is formed over and electrically connected to the first source/drain region. In addition, the method includes forming a first spacer structure on a sidewall of the bit line structure and a sidewall of the patterned mask, and forming a capacitor contact over and electrically connected to the second source/drain region, wherein the first spacer structure is sandwiched between the bit line structure and the capacitor contact. The method also includes forming a second spacer structure over the first spacer structure, and performing a heat treatment process to form an air gap in the first spacer structure after the second spacer structure is formed.

In yet another embodiment of the present disclosure, a semiconductor device is provided. The semiconductor device includes a first source/drain region and a second source/drain region disposed in a semiconductor substrate, and a first conductive feature disposed over and electrically connected to the first source/drain region. The semiconductor device also includes a second conductive feature disposed over and electrically connected to the second source/drain region, and a first spacer structure sandwiched between the first conductive feature and the second conductive feature. The first spacer structure includes an air gap. The semiconductor device further includes a second spacer structure disposed over the first spacer structure. The air gap is covered by the second spacer structure.

The embodiments of the present disclosure have some advantageous features. By performing a heat treatment process to transform a portion of the first spacer structure into an air gap, the parasitic capacitance between the conductive features on opposite sides of the first spacer structure may be reduced, and the remaining portions of the first spacer structure may provide additional structural support to the semiconductor device. Moreover, by forming the second spacer structure over the first spacer structure, undesirable short circuit may be prevented. As a result, the overall device performance may be improved, and the yield rate of the semiconductor device may be increased.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for forming a semiconductor device, comprising:
    forming a first source/drain region and a second source/drain region in a semiconductor substrate;
    forming a first conductive feature over and electrically connected to the first source/drain region;
    forming a first spacer structure on a sidewall of the first conductive feature;
    forming a second conductive feature over and electrically connected to the second source/drain region, wherein the second conductive feature is adjacent to the first spacer structure, and the first spacer structure is etched during the forming the second conductive feature;

forming a second spacer structure over the etched first spacer structure; and performing a heat treatment process to transform a portion of the first spacer structure into an air gap after the second spacer structure is formed.

2. The method for forming a semiconductor device of claim 1, wherein the first spacer structure is a tri-layer structure comprising an inner spacer contacting the first conductive feature, a middle spacer, and an outer spacer separating from the inner spacer by the middle spacer, and wherein the middle spacer is made of an energy removable material, and the energy removable material is transformed into the air gap by the heat treatment process.

3. The method for forming a semiconductor device of claim 1, further comprising:

forming a conductive pad over and electrically connected to the second conductive feature, wherein the second spacer structure is covered by the conductive pad.

4. The method for forming a semiconductor device of claim 1, wherein the forming the first conductive feature comprises:

etching the semiconductor substrate to form an opening over the first source/drain region;

forming a semiconductor layer over the semiconductor substrate, wherein the opening is filled by a portion of the semiconductor layer;

forming a metal layer over the semiconductor layer;

forming a patterned mask over the metal layer; and etching the metal layer and the semiconductor layer using the patterned mask as a mask.

5. The method for forming a semiconductor device of claim 4, wherein the portion of the semiconductor layer in the opening is partially removed during the etching the metal layer and the semiconductor layer, and the first spacer structure is formed to cover a sidewall of the portion of the semiconductor layer and a sidewall of the patterned mask.

6. The method for forming a semiconductor device of claim 5, wherein the sidewall of the patterned mask is partially exposed after the second conductive feature is formed, and the second spacer structure is in direct contact with the sidewall of the patterned mask and a top surface of the second conductive feature.

7. The method for forming a semiconductor device of claim 1, further comprising:

forming a barrier layer covering the etched first spacer structure and the second conductive feature;

forming the second spacer structure over the barrier layer; and etching the barrier layer using the second spacer structure as a mask before the heat treatment process is performed.

8. A method for forming a semiconductor device, comprising:

forming a first source/drain region and a second source/drain region in a semiconductor substrate;

forming a semiconductor layer over the semiconductor substrate;

forming a metal layer over the semiconductor layer;

forming a patterned mask over the metal layer;

etching the semiconductor layer and the metal layer to form a bit line structure using the patterned mask as a mask, wherein the bit line structure is formed over and electrically connected to the first source/drain region;

forming a first spacer structure on a sidewall of the bit line structure and a sidewall of the patterned mask;

forming a capacitor contact over and electrically connected to the second source/drain region, wherein the first spacer structure is sandwiched between the bit line structure and the capacitor contact;

forming a second spacer structure over the first spacer structure; and performing a heat treatment process to form an air gap in the first spacer structure after the second spacer structure is formed.

9. The method for forming a semiconductor device of claim 8, further comprising:

etching the semiconductor substrate to form an opening over the first source/drain region;

filling the opening with a portion of the semiconductor layer, wherein the portion of the semiconductor layer is partially removed during the etching the semiconductor layer such that a gap is formed alongside the bit line structure; and filling the gap with the first spacer structure.

10. The method for forming a semiconductor device of claim 8, further comprising:

forming a first dielectric layer over the second source/drain region after the first spacer structure is formed;

partially etching the first dielectric layer to expose the second source/drain region;

depositing a conductive material to cover the second source/drain region; and performing an etch-back process on the conductive material to form the capacitor contact, wherein the first spacer structure is partially etched during the etch-back process.

11. The method for forming a semiconductor device of claim 10, further comprising:

forming a sealing layer covering the etched first spacer structure and the capacitor contact before the second spacer structure is formed, wherein the sealing layer comprises at least one of silicon (Si), germanium (Ge), gallium (Ga), arsenic (As), indium (In), phosphorus (P), copper (Cu), selenium (Se), titanium (Ti), tantalum (Ta) or tungsten (W).

12. The method for forming a semiconductor device of claim 11, further comprising:

performing an oxidation or nitridation treatment to transform the sealing layer into a barrier layer;

forming the second spacer structure over the barrier layer; and etching the barrier layer using the second spacer structure as a mask.

13. The method for forming a semiconductor device of claim 8, further comprising:

forming a second dielectric layer covering the second spacer structure and the capacitor contact; and forming a conductive pad penetrating through the second dielectric layer, wherein the conductive pad is disposed over and electrically connected to the capacitor contact, and the conductive pad is in direct contact with the second spacer structure.

14. A semiconductor device, comprising:

a first source/drain region and a second source/drain region disposed in a semiconductor substrate;

a first conductive feature disposed over and electrically connected to the first source/drain region;

a second conductive feature disposed over and electrically connected to the second source/drain region;

a first spacer structure sandwiched between the first conductive feature and the second conductive feature, wherein the first spacer structure comprises an air gap; and a second spacer structure disposed over the first spacer structure, wherein the air gap is covered by the second spacer structure.

15. The semiconductor device of claim 14, wherein the first spacer structure comprises an inner spacer contacting the first conductive feature and an outer spacer contacting the second conductive feature, and the air gap is sandwiched between the inner spacer and the outer spacer.

16. The semiconductor device of claim 14, wherein the air gap of the first spacer structure extends into the semiconductor substrate.

17. The semiconductor device of claim 14, wherein a portion of the second conductive feature is covered by the second spacer structure.

18. The semiconductor device of claim 14, further comprising:

a patterned mask disposed over the bit line structure, wherein the second spacer structure is disposed on a sidewall of the patterned mask.

19. The semiconductor device of claim 18, further comprising:

a conductive pad disposed over and electrically connected to the second conductive feature, wherein the conductive pad extends over the second spacer structure and the patterned mask.

20. The semiconductor device of claim 19, further comprising:

a barrier portion sandwiched between the first spacer structure and the second spacer structure, wherein a portion of the second conductive feature is covered by the barrier portion.

* * * * *